US009521766B2

(12) United States Patent
Claeys et al.

(10) Patent No.: US 9,521,766 B2
(45) Date of Patent: Dec. 13, 2016

(54) HIGH DENSITY TELECOMMUNICATIONS SYSTEMS WITH CABLE MANAGEMENT AND HEAT DISSIPATION FEATURES

(71) Applicants: Tyco Electronics Raychem BVBA, Kessel-Lo (BE); Tyco Electronics Nederland BV, 'S-Hertogenbosch (NL)

(72) Inventors: Didier Pierre W Claeys, Schaffen (BE); Danny Ghislain Thijs, Zonhoven (BE); Sebastiaan Roger Neerincx, HR Tilburg (NE)

(73) Assignees: CommScope Connectivity Belgium BVBA, Kessel-Lo (BE); CommScope Asia Holdings B.V., Bussum (NL)

( * ) Notice: Subject to any disclaimer, the term of this patent is extended or adjusted under 35 U.S.C. 154(b) by 257 days.

(21) Appl. No.: 13/912,778

(22) Filed: Jun. 7, 2013

(65) Prior Publication Data

US 2014/0002992 A1     Jan. 2, 2014

Related U.S. Application Data

(60) Provisional application No. 61/665,193, filed on Jun. 27, 2012.

(51) Int. Cl.
*H05K 5/02*        (2006.01)
*H05K 5/03*        (2006.01)
(Continued)

(52) U.S. Cl.
CPC ............ *H05K 5/0213* (2013.01); *H04Q 1/025* (2013.01); *H04Q 1/06* (2013.01); *H05K 5/0247* (2013.01); *H05K 5/03* (2013.01)

(58) Field of Classification Search
CPC ...... H05K 5/0213; H05K 5/0247; H05K 5/03; H05K 1/02; H05K 1/14; H05K 7/14; H05K 7/18; H05K 1/18; H05K 5/00; H04Q 1/025; H04Q 1/06; H04Q 1/10; H04M 1/02; H04M 1/0289; H04M 1/6041
(Continued)

(56) References Cited

U.S. PATENT DOCUMENTS 2,773,940 A    12/1956   Lebedinsky
3,852,703 A    12/1974   Carney et al.
(Continued)

FOREIGN PATENT DOCUMENTS

DE    35 06 447 A1    10/1985
DE    3743632         7/1989
(Continued)

OTHER PUBLICATIONS

Invitation to Pay Additional Fees with Partial International Search for PCT/EP2013/063476 mailed Oct. 18, 2013.
(Continued)

*Primary Examiner* — Courtney Smith
*Assistant Examiner* — Matt Dhillon
(74) *Attorney, Agent, or Firm* — Merchant & Gould P.C.

(57) ABSTRACT

A telecommunications system (10/100) is disclosed herein. The telecommunications system (10/100) includes a chassis (12/112) defining a top end (14/114), a bottom end (16/116), and a generally pyramidal shape, wherein a transverse cross-sectional footprint (28) of the chassis (12/112) changes in outer dimension as the transverse cross-sectional footprint (28) extends from the top end (14/114) to the bottom end (16/116), the telecommunications chassis (12/112) further defining at least one sidewall (30/130, 32/132, 34/134, 36/136), the at least one sidewall (30/130, 32/132, 34/134, 36/136) extending at an angle to both the top end (14/114) and the bottom end (16/116), the at least one sidewall (30/130, 32/132, 34/134, 36/136) defining ports (38) defining connection locations for receiving telecommunications equipment.

26 Claims, 23 Drawing Sheets

(51) Int. Cl.
*H04Q 1/02* (2006.01)
*H04Q 1/06* (2006.01)

(58) Field of Classification Search
USPC ......... 361/223.1, 223.6, 695, 728, 730, 733,
361/752, 788, 796, 823, 826, 829;
385/134, 135, 147
See application file for complete search history.

(56) References Cited

U.S. PATENT DOCUMENTS

| | | | |
|---|---|---|---|
| 3,952,310 A * | 4/1976 | Griffee | H01Q 21/29 343/730 |
| 4,480,880 A | 11/1984 | Cather | |
| 4,548,453 A | 10/1985 | Mummey et al. | |
| 4,603,377 A | 7/1986 | Kabayashi et al. | |
| 4,649,236 A | 3/1987 | De Luca et al. | |
| 4,665,546 A | 5/1987 | Brey et al. | |
| 4,722,702 A | 2/1988 | De Luca et al. | |
| 4,737,985 A | 4/1988 | De Luca et al. | |
| 4,749,968 A | 6/1988 | Burroughs | |
| 4,770,639 A | 9/1988 | Lau | |
| 4,820,200 A | 4/1989 | Lau | |
| 4,840,568 A | 6/1989 | Burroughs et al. | |
| 4,861,281 A | 8/1989 | Warner | |
| 4,911,661 A | 3/1990 | Neuwirth | |
| 4,975,087 A | 12/1990 | Williams et al. | |
| 5,145,416 A | 9/1992 | Cruise et al. | |
| 5,170,327 A | 12/1992 | Burroughs | |
| 5,199,878 A | 4/1993 | Dewey et al. | |
| 5,220,600 A | 6/1993 | Chouanard et al. | |
| 5,233,501 A | 8/1993 | Allen et al. | |
| D343,828 S | 2/1994 | Leitermann et al. | |
| D344,072 S | 2/1994 | Bates et al. | |
| 5,393,249 A | 2/1995 | Morgenstern et al. | |
| 5,413,494 A | 5/1995 | Dewey et al. | |
| 5,417,588 A | 5/1995 | Olson et al. | |
| 5,460,441 A | 10/1995 | Hastings et al. | |
| 5,467,062 A | 11/1995 | Burroughs | |
| 5,482,469 A | 1/1996 | Seiceanu et al. | |
| 5,546,282 A | 8/1996 | Hill et al. | |
| 5,634,822 A | 6/1997 | Gunell | |
| 5,685,741 A | 11/1997 | Dewey et al. | |
| 5,738,546 A | 4/1998 | Burroughs et al. | |
| 5,784,251 A | 7/1998 | Miller et al. | |
| 5,885,112 A | 3/1999 | Louwagie et al. | |
| 5,903,829 A | 5/1999 | Anderson et al. | |
| 5,909,155 A | 6/1999 | Anderson et al. | |
| 5,938,478 A | 8/1999 | Werner | |
| 5,955,930 A | 9/1999 | Anderson et al. | |
| 6,025,803 A * | 2/2000 | Bergen | H01Q 1/246 343/700 MS |
| 6,038,766 A | 3/2000 | Werner | |
| 6,049,709 A | 4/2000 | Anderson et al. | |
| 6,116,961 A | 9/2000 | Henneberger et al. | |
| 6,208,522 B1 | 3/2001 | Manweiler et al. | |
| 6,269,162 B1 | 7/2001 | McMillan | |
| 6,289,210 B1 | 9/2001 | Anderson et al. | |
| 6,327,139 B1 | 12/2001 | Champion et al. | |
| 6,438,310 B1 | 8/2002 | Lance et al. | |
| 6,504,988 B1 | 1/2003 | Trebesch et al. | |
| 6,625,374 B2 | 9/2003 | Holman et al. | |
| 6,626,705 B2 | 9/2003 | Perrone et al. | |
| 6,650,885 B2 | 11/2003 | Anderson et al. | |
| 6,677,520 B1 | 1/2004 | Kim et al. | |
| 6,685,033 B1 | 2/2004 | Baddour et al. | |
| 6,715,619 B2 | 4/2004 | Kim et al. | |
| 6,748,155 B2 | 6/2004 | Kim et al. | |
| 6,759,992 B2 * | 7/2004 | Knop | H01Q 13/0225 343/786 |
| 6,792,190 B2 | 9/2004 | Xin et al. | |
| 6,799,998 B2 | 10/2004 | Henneberger et al. | |
| 6,830,466 B2 | 12/2004 | Mendoza | |
| 6,875,060 B2 | 4/2005 | Musolf et al. | |
| 6,918,793 B2 | 7/2005 | Baker et al. | |
| 6,933,909 B2 * | 8/2005 | Theobold | H01Q 25/00 343/853 |
| 6,968,111 B2 | 11/2005 | Trebesch et al. | |
| 6,975,510 B1 | 12/2005 | Robbins et al. | |
| 6,994,593 B2 | 2/2006 | Baker et al. | |
| 7,031,588 B2 | 4/2006 | Cowley et al. | |
| 7,061,767 B2 | 6/2006 | Schmidtke et al. | |
| 7,068,907 B2 | 6/2006 | Schray | |
| 7,095,844 B2 | 8/2006 | Baker et al. | |
| 7,097,047 B2 | 8/2006 | Lee et al. | |
| 7,120,348 B2 | 10/2006 | Trebesch et al. | |
| 7,127,042 B2 | 10/2006 | Grosse-Boes et al. | |
| 7,137,512 B2 | 11/2006 | Nguyen et al. | |
| 7,151,663 B2 * | 12/2006 | Bilger | G02F 1/133308 349/149 |
| 7,171,099 B2 | 1/2007 | Barnes et al. | |
| 7,197,294 B2 | 3/2007 | Anderson et al. | |
| 7,302,154 B2 | 11/2007 | Trebesch et al. | |
| 7,308,184 B2 | 12/2007 | Barnes et al. | |
| 7,358,921 B2 * | 4/2008 | Snyder | H01Q 9/28 343/793 |
| 7,418,182 B2 | 8/2008 | Krampotich | |
| 7,437,049 B2 | 10/2008 | Krampotich | |
| 7,463,811 B2 | 12/2008 | Trebesch et al. | |
| 7,499,623 B2 | 3/2009 | Barnes et al. | |
| 7,607,938 B2 * | 10/2009 | Clark | H04Q 1/136 385/135 |
| 7,764,781 B2 | 7/2010 | Gonzalez Blazquez et al. | |
| 7,911,791 B2 * | 3/2011 | Refai-Ahmed | H01L 23/427 165/121 |
| 8,113,473 B2 * | 2/2012 | Bradley | E04H 12/2253 174/158 F |
| 8,244,203 B2 | 8/2012 | Anderson et al. | |
| 8,600,208 B2 | 12/2013 | Badar et al. | |
| 2002/0118820 A1 | 8/2002 | Sinclair, III et al. | |
| 2002/0173188 A1 | 11/2002 | Follingstad et al. | |
| 2003/0016181 A1 * | 1/2003 | Engargiola | H01Q 11/10 343/792.5 |
| 2003/0222034 A1 | 12/2003 | Champion et al. | |
| 2004/0077220 A1 | 4/2004 | Musolf et al. | |
| 2004/0119386 A1 | 6/2004 | Guidez | |
| 2004/0164917 A1 * | 8/2004 | Nilsson | H01Q 9/44 343/773 |
| 2004/0183736 A1 * | 9/2004 | Sato | H01Q 1/243 343/725 |
| 2005/0202728 A1 * | 9/2005 | Baker | H04Q 1/136 439/668 |
| 2006/0067068 A1 * | 3/2006 | Petersen | H04Q 1/142 361/788 |
| 2006/0087805 A1 * | 4/2006 | Massih | G06F 1/181 361/679.02 |
| 2006/0165365 A1 * | 7/2006 | Feustel | G02B 6/4452 385/135 |
| 2006/0193590 A1 * | 8/2006 | Puetz | G02B 6/4452 385/135 |
| 2007/0047894 A1 * | 3/2007 | Holmberg | G02B 6/4455 385/135 |
| 2007/0211882 A1 | 9/2007 | Hatte et al. | |
| 2007/0211883 A1 | 9/2007 | Franzke et al. | |
| 2008/0175550 A1 * | 7/2008 | Coburn | G02B 6/4453 385/134 |
| 2008/0233858 A1 * | 9/2008 | Womac | H05K 7/1425 454/184 |
| 2009/0090538 A1 | 4/2009 | Jones et al. | |
| 2009/0185782 A1 * | 7/2009 | Parikh | G02B 6/4446 385/135 |
| 2009/0207577 A1 * | 8/2009 | Fransen | H01R 13/514 361/790 |
| 2011/0267767 A1 | 11/2011 | Sun | |
| 2012/0025750 A1 * | 2/2012 | Margo | H01M 10/465 320/101 |

(56) References Cited

U.S. PATENT DOCUMENTS

2012/0282868 A1* 11/2012 Hahn ............... H01Q 3/242
                                                   455/90.3
2013/0330043 A1* 12/2013 Goldsmith .......... G02B 6/4452
                                                   385/70

FOREIGN PATENT DOCUMENTS

| WO | WO 96/38884      | 12/1996 |
|----|------------------|---------|
| WO | WO 99/26427      | 5/1999  |
| WO | WO 2008/027562 A2 | 3/2008  |

OTHER PUBLICATIONS

Two sheets of drawings showing ADC's 64-CKT SKI/Flex Module All Front Access with I/O Monitor, Catalog No. DFX-IFA064, Drawing No. 1102779, Mar. 27, 2000.

Four sheets of drawings showing ADC's Assembly, Chassis Wire Wrap, Flex-X, Catalog No. DFX-IFA064, Drawing No. 1102777, Oct. 6, 2000.

Four sheets of drawings showing ADC's W/W Chassis Assembly Installation, Catalog No. DFS-100001-DPM, Drawing No. 1126536, Aug. 22, 2000.

Two sheets of drawings showing ADC's RJ45 Chassis Assembly Installation, Catalog No. DFS-120001, Drawing No. 1132584, Sep. 28, 2000.

Two sheets of drawings showing ADC's Monitor Panel, 64CKT Installation, Catalog No. DIM-IA3050, Drawing No. 1188817, Oct. 8, 2001.

ADC, "DSX1 New Products, Monitor Panels," 2 pages (date unknown).

Telect, product sheet entitled "E1 64 Circuit Panel, Telect Part No. E64-5000-1100," obtained from E1 64 Circuit Panel, Telect, Inc. Official Website at http://www.telect.com/index.cfm?object=1499 &op=1,992,701,1430,1495,1498,1499 on Jun. 13, 2001, 3 pages.

Telect, product sheet entitled "E1 64 Circuit Panel, Telect Part No. E64-5000-1200," obtained from E1 64 Circuit Panel, Telect, Inc. Official Website at http://www.telect.com/index.cfm?object=1500 &op=1,992,701,1430,1495,1498,1500 on Jun. 13, 2001, 3 pages.

International Search Report and Written Opinion for PCT/EP2013/063476 mailed Dec. 6, 2013.

* cited by examiner

HIGH DENSITY TELECOMMUNICATIONS SYSTEMS WITH CABLE MANAGEMENT AND HEAT DISSIPATION FEATURES

CROSS-REFERENCE TO RELATED APPLICATION

The present patent application claims the benefit of U.S. Provisional Patent Application Ser. No. 61/665,193, filed Jun. 27, 2012, which application is hereby incorporated by reference in its entirety.

TECHNICAL FIELD

The present disclosure relates generally to telecommunications equipment. More particularly, the present disclosure relates to high density telecommunications systems including telecommunications chassis or frames for housing telecommunications equipment, the telecommunications chassis or frames including cable management and heat dissipation features.

BACKGROUND

In telecommunications, high density is desirable. However, achieving high density in telecommunication connectivity leads to certain design challenges. Cable management is an important factor that must be taken into consideration in configuration of high density equipment. Heat dissipation is also crucial when using high density telecommunications equipment such as high density electronic equipment. In high density applications such as telecommunications chassis or frames that house a large number of devices in a stacked arrangement, the heat created by such equipment must be effectively exhausted.

There is a need in the art for telecommunications equipment that can achieve high connectivity density with proper cable management as well as effective heat dissipation for the equipment.

SUMMARY

The present disclosure relates to high density mounting arrangements for mounting telecommunications equipment to chassis, the chassis providing cable management and heat dissipation.

Various telecommunications systems of the present disclosure also include chassis, corresponding telecommunications equipment mounted therein, and mounting arrangements that are configured to provide various signal speeds between the equipment within a given chassis. The chassis, the mounted equipment, and the mounting arrangements are configured and shaped to provide multiple different speed zones for signals passing between equipment mounted within the chassis.

According to one example aspect, the present disclosure relates to a telecommunications system comprising a telecommunications chassis defining a top end, a bottom end, and a generally pyramidal shape, wherein a transverse cross-sectional footprint of the chassis changes in outer dimension as the transverse cross-sectional footprint extends from the top end to the bottom end, the telecommunications chassis further defining at least one sidewall, the at least one sidewall extending at an angle to both the top end and the bottom end, the at least one sidewall defining ports defining connection locations for receiving telecommunications equipment.

According to another example aspect, the present disclosure relates to a telecommunications system comprising a telecommunications chassis defining a top end, a bottom end, and a central longitudinal axis extending between the top end and the bottom end, the telecommunications chassis defining a generally pyramidal shape, wherein a transverse cross-sectional footprint of the chassis changes in outer dimension as the transverse cross-sectional footprint extends from the top end to the bottom end, the telecommunications chassis further defining a front wall, a rear wall, a right wall, and a left wall, each of the front, rear, right, and left walls extending at an angle to both the top end and the bottom end and each of the front, rear, right, and left walls defining ports that define connection locations for receiving telecommunications equipment. A central opening extends through the chassis in a direction parallel to the central longitudinal axis and a cable trough is defined by each of the front, rear, right, and left walls extending between the top end and the bottom end, each cable trough extending parallel to its associated front, rear, right, and left wall.

According to another example aspect, the present disclosure relates to a telecommunications system comprising a telecommunications chassis defining a top end, a bottom end, and a central longitudinal axis extending between the top end and the bottom end, the telecommunications chassis including ports around an outer perimeter of the telecommunications chassis, the ports defining connection locations for receiving telecommunications equipment, wherein the telecommunications chassis provides 360 degree accessibility around the perimeter of the telecommunications chassis to the ports. A central heat dissipation structure defining an opening extends through the chassis in a direction parallel to the central longitudinal axis, wherein the ports are defined generally radially around the central heat dissipation structure.

The present disclosure further relates to a piece of telecommunications equipment comprising a printed circuit board having a generally triangular shape including two right-angle sides and a third side connecting the two right-angle sides, wherein at least one of the two right-angle sides defines telecommunications connectors for connecting to other telecommunications equipment and the third side includes ports defining connection locations for receiving other telecommunications equipment.

A variety of additional inventive aspects will be set forth in the description that follows. The inventive aspects can relate to individual features and combinations of features. It is to be understood that both the foregoing general description and the following detailed description are exemplary and explanatory only and are not restrictive of the broad inventive concepts upon which the embodiments disclosed herein are based.

DETAILED DESCRIPTION

Figure 1:
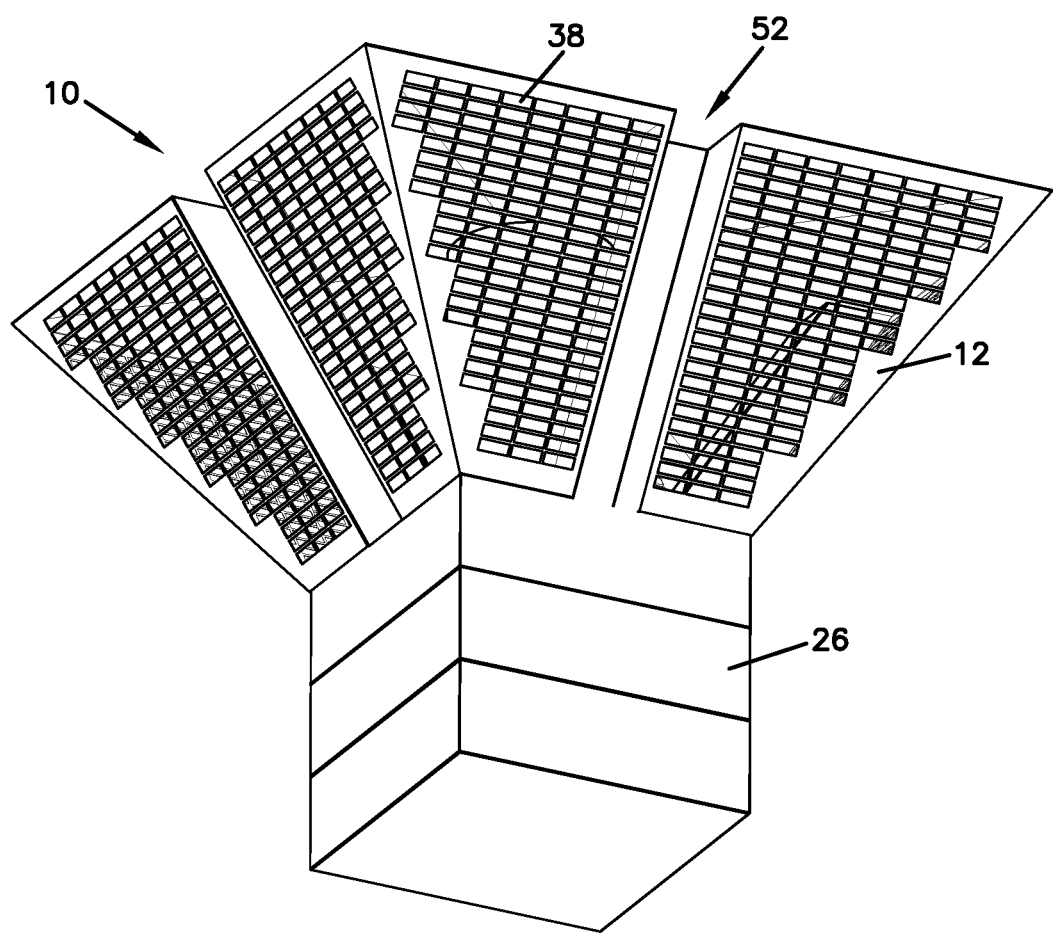
FIG. 1 is a bottom, front, left side perspective view of a first embodiment of a telecommunications system having features that are examples of inventive aspects in accordance with the present disclosure.

Reference will now be made in detail to examples of inventive aspects of the present disclosure which are illustrated in the accompanying drawings. Wherever possible, the same reference numbers will be used throughout the drawings to refer to the same or like parts.

According to the present disclosure, a telecommunications system including a telecommunication chassis for housing telecommunications equipment is shown and described herein. The telecommunications chassis includes cable management and heat dissipation features. The present disclosure is also directed to various aspects of the telecommunications systems such as the chassis, corresponding telecommunications equipment mounted therein, and mounting arrangements that are configured to provide various signal speeds between the equipment within a given chassis. As will be described in further detail below, the chassis, the mounted equipment, and the mounting arrangements are configured and shaped to provide multiple different speed zones for signals (e.g., electronic or fiber optic) passing among equipment mounted within the chassis.

Referring now to FIGS. 1-5, a first embodiment of a telecommunications system 10 having features that are examples of inventive aspects in accordance with the principles of the present disclosure is illustrated. Another embodiment of a telecommunications system 100 including features similar to the first embodiment is shown in FIGS. 6-11.

The telecommunications system 10 of FIGS. 1-5 includes a telecommunications chassis 12 that defines a top end 14, a bottom end 16, a front side 18, a rear side 20, a right side 22, and a left side 24. The chassis 12 is shown with a plurality of equipment 26 mounted to the bottom end 16 thereof, wherein the equipment 26 are mounted in a stacked arrangement. As will be discussed in further detail below, the equipment 26 mounted to the bottom end 16 of the chassis 12 may be telecommunications equipment or other types of equipment.

In the present disclosure, the term "telecommunications chassis" may also be referred to as a "telecommunications frame" or a "telecommunications tower."

Figure 5:
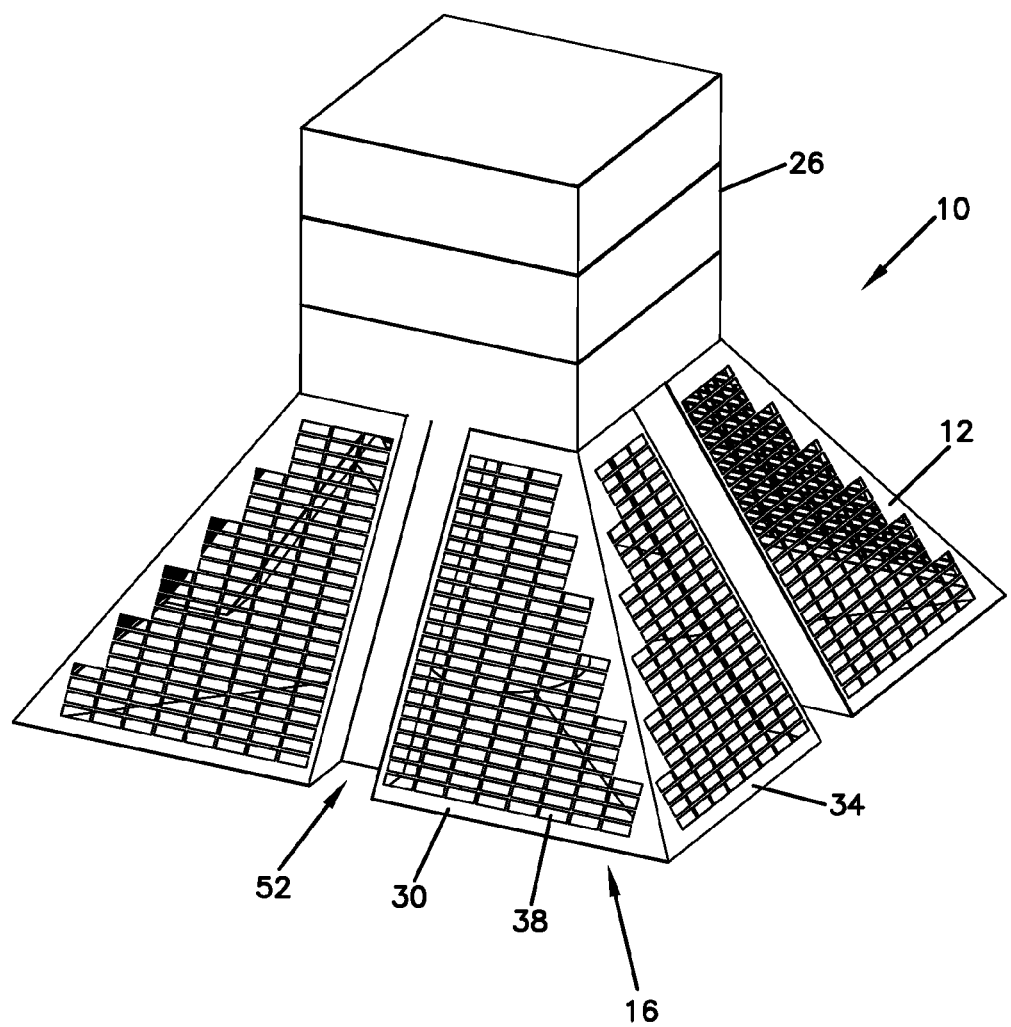
FIG. 5 illustrates the telecommunications system of FIG. 1 in a different orientation.

As shown, the chassis 12 defines a generally pyramidal configuration or shape. The chassis 12 is generally configured such that a transverse cross-sectional footprint 28 of the chassis 12 decreases in outer dimension as it extends from the top end 14 toward the bottom end 16. It should also be noted that in other applications, the chassis 12 may be mounted in an orientation that is 180 degrees from the orientation shown in FIGS. 1-4. An example use of the chassis 12 in such a reverse orientation is shown in FIG. 5. In such an orientation, the transverse cross-sectional footprint 28 of the chassis 12 can be said to increase in outer dimension as it extends from the top end 14 toward the bottom end 16.

Figure 15:
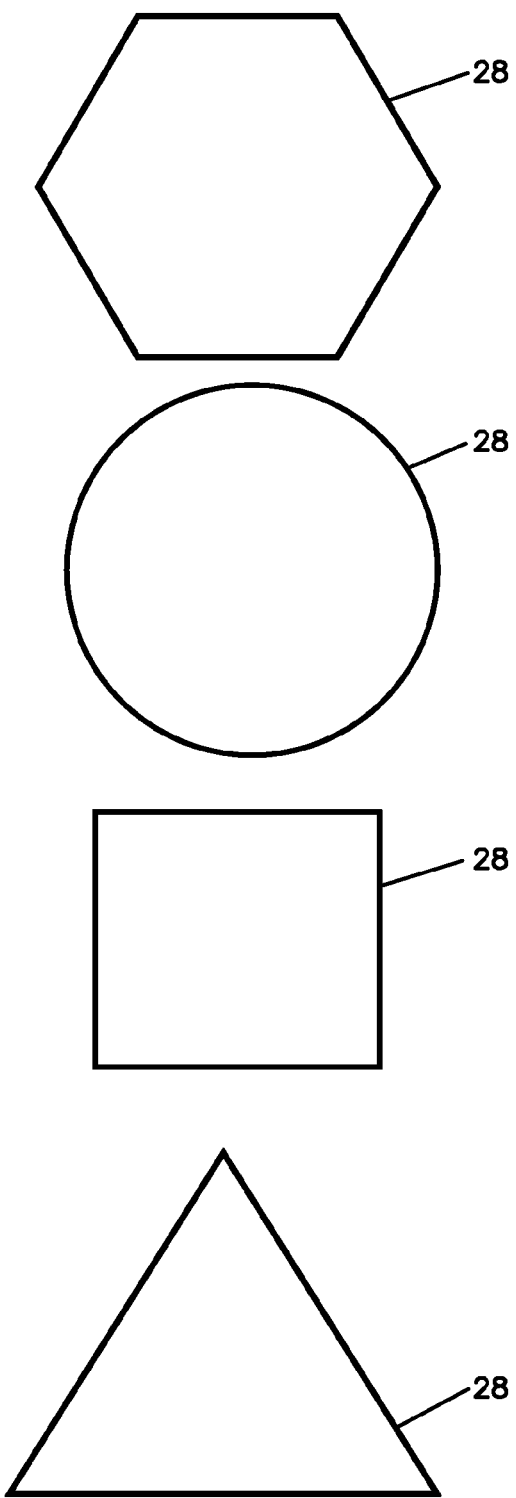
FIG. 15 illustrates various examples of cross-sectional footprints that might be used in configuring the pyramidal or conical shaped chassis of the present disclosure, wherein three of the footprints are polygons for forming a pyramidal shape and one is a circle for forming a right circular conical shape.
Figure 16:
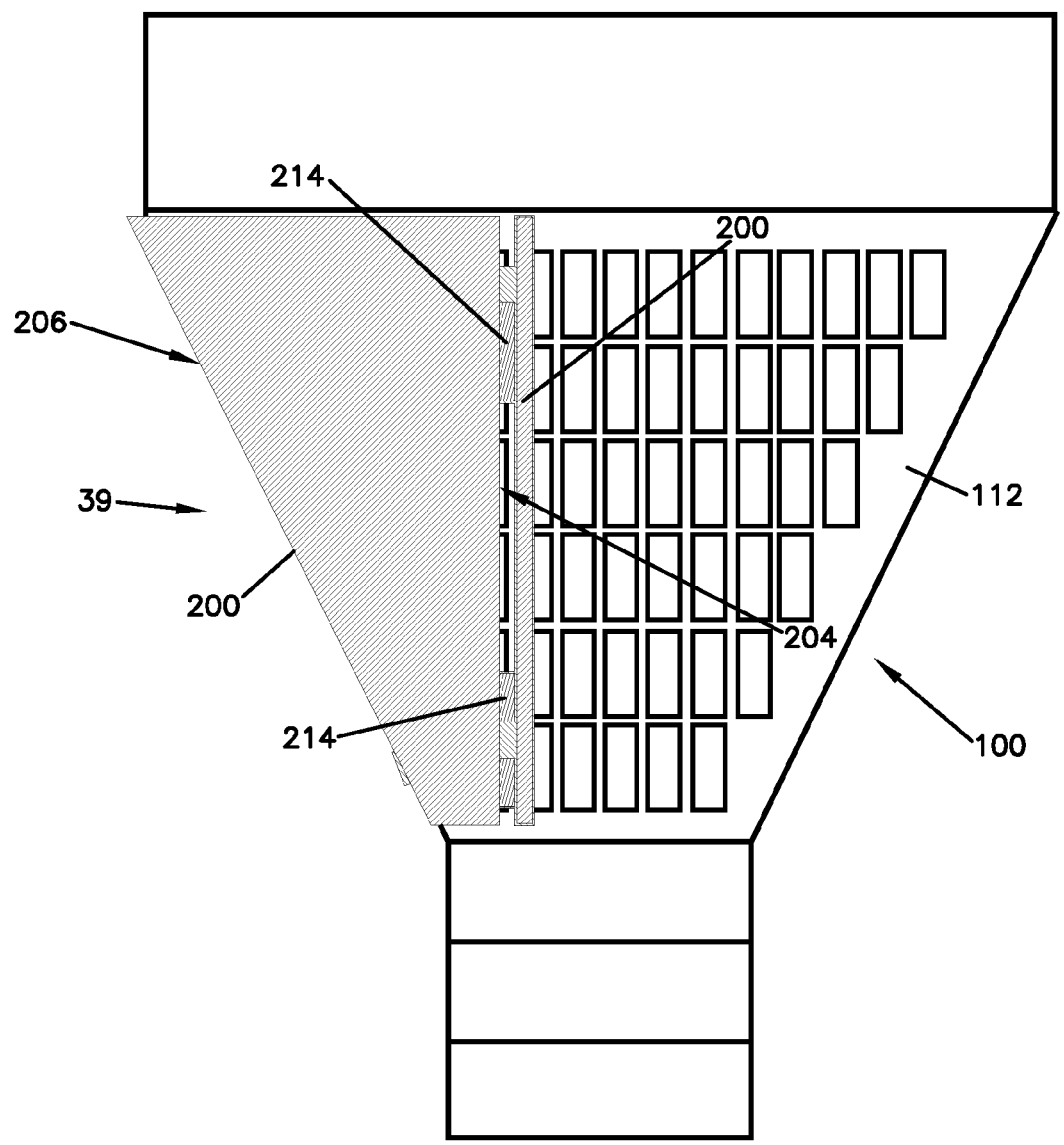
FIG. 16 diagrammatically illustrates the side view of an example telecommunications equipment mounting arrangement used with the chassis of FIG. 6.
Figure 17:
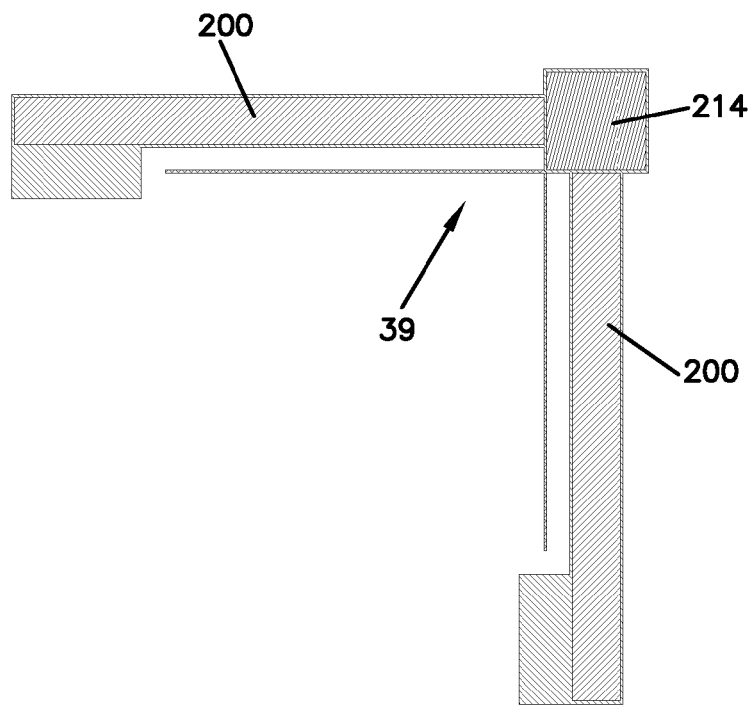
FIG. 17 diagrammatically illustrates the mounting arrangement of FIG. 16 from a top view.
Figure 18:
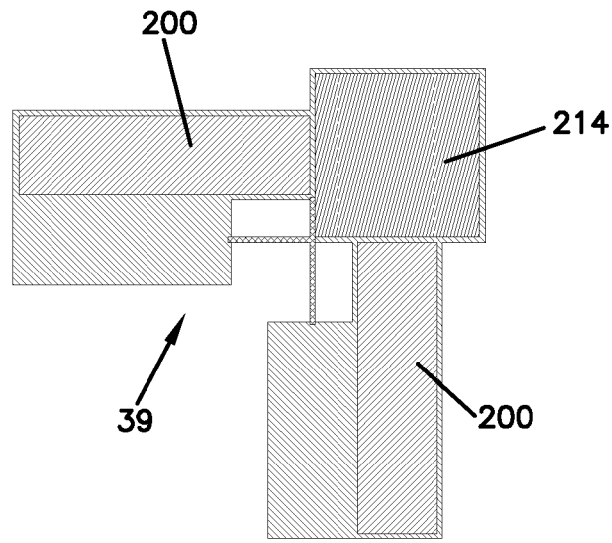
FIG. 18 diagrammatically illustrates the mounting arrangement of FIG. 16 from a bottom view.

It should also be noted that in embodiments wherein the transverse cross-sectional footprint 28 of the chassis might define a circle, rather than a polygon, the chassis may be said to define a conical shape (e.g., such as a right circular cone). FIG. 15 illustrates various examples of cross-sectional footprints 28 that might be used in configuring the pyramidal or conical shaped chassis 12 of the present disclosure. Referring to FIG. 15, three of the footprints 28 are polygons (e.g., a hexagon, a rectangle, and a triangle) for forming a pyramidal shape and one footprint 28 is a circle for forming a right circular conical shape.

Due to the pyramidal shape, each of a front wall 30 at the front side 18, a rear wall 32 at the rear side 20, a right wall 34 at the right side 22, and a left wall 36 at the left side 24 is disposed at an angle with respect to the top and bottom ends 14, 16 of the chassis 12.

Each of the front wall 30, the rear wall 32, the right wall 34, and the left wall 36 defines receptacles or ports 38. The ports 38 may define or provide access to connection locations for receiving telecommunications equipment such as plugs or connectors that might be connected to equipment 39 mounted within the interior 40 of the chassis 12. For example, if the telecommunications equipment 39 mounted within the chassis 12 includes telecommunications modules such as jack modules or cassettes that have connection locations defined by or accessible from the ports or receptacles 38, plugs or connectors may be coupled to the jacks at these connection locations.

According to certain embodiments, the equipment 39 mounted within the chassis may include electrical equipment such as digital cross-connect jack modules or cassettes. Such modules may include jacks having RJ-45 profiles such as cat-5e jacks, 10-gig jacks, etc., as known in the art. These jack modules or cassettes may define connection locations at the fronts of the modules for receiving plugs or connectors. According to certain embodiments, connection locations may also be defined at the rears of the modules by structures such as card edge connectors.

Figure 2:
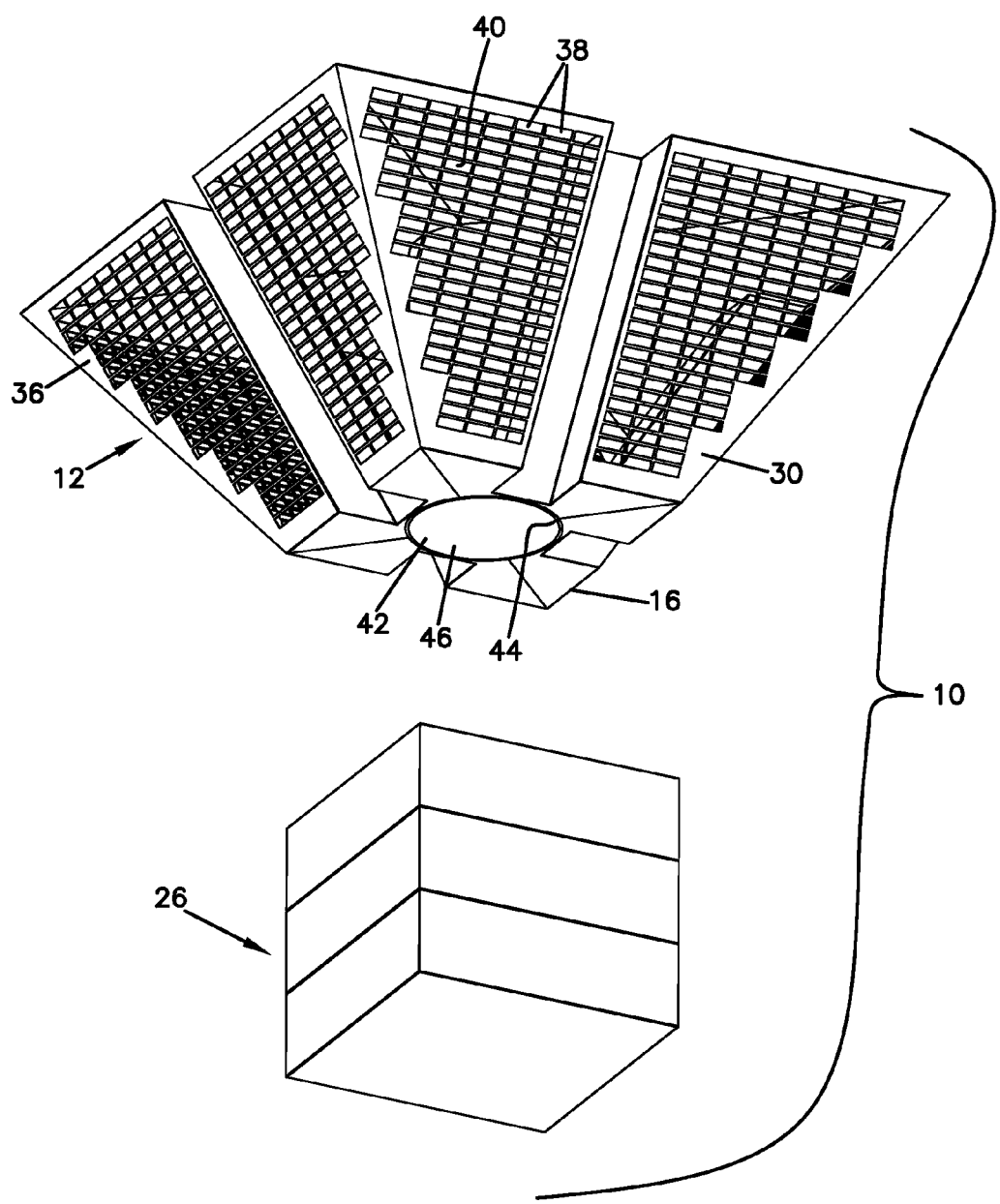
FIG. 2 illustrates the telecommunications system of FIG. 1 in an exploded configuration.
Figure 3:
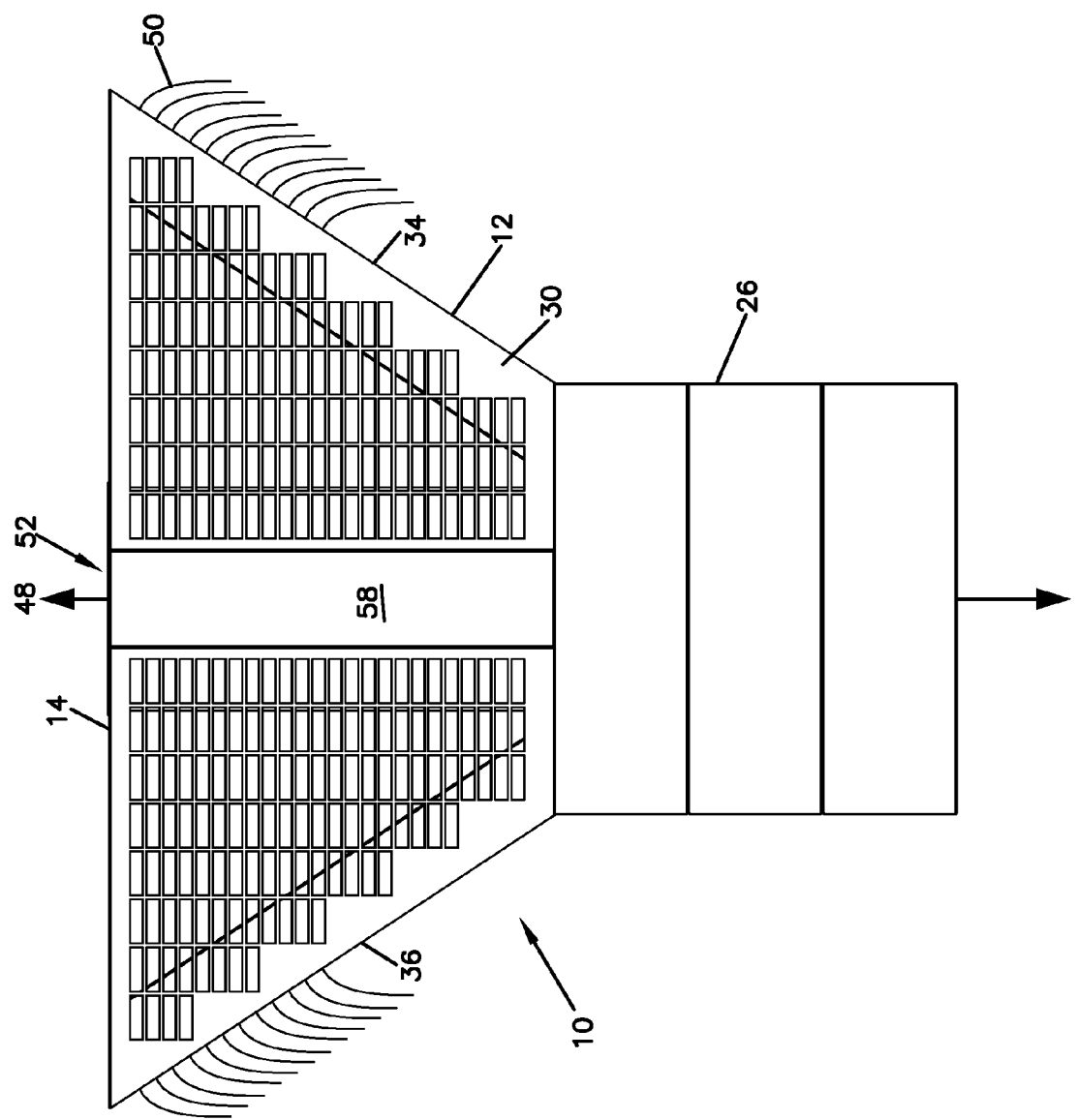
FIG. 3 is a front view of the telecommunications system of FIG. 1.
Figure 4:
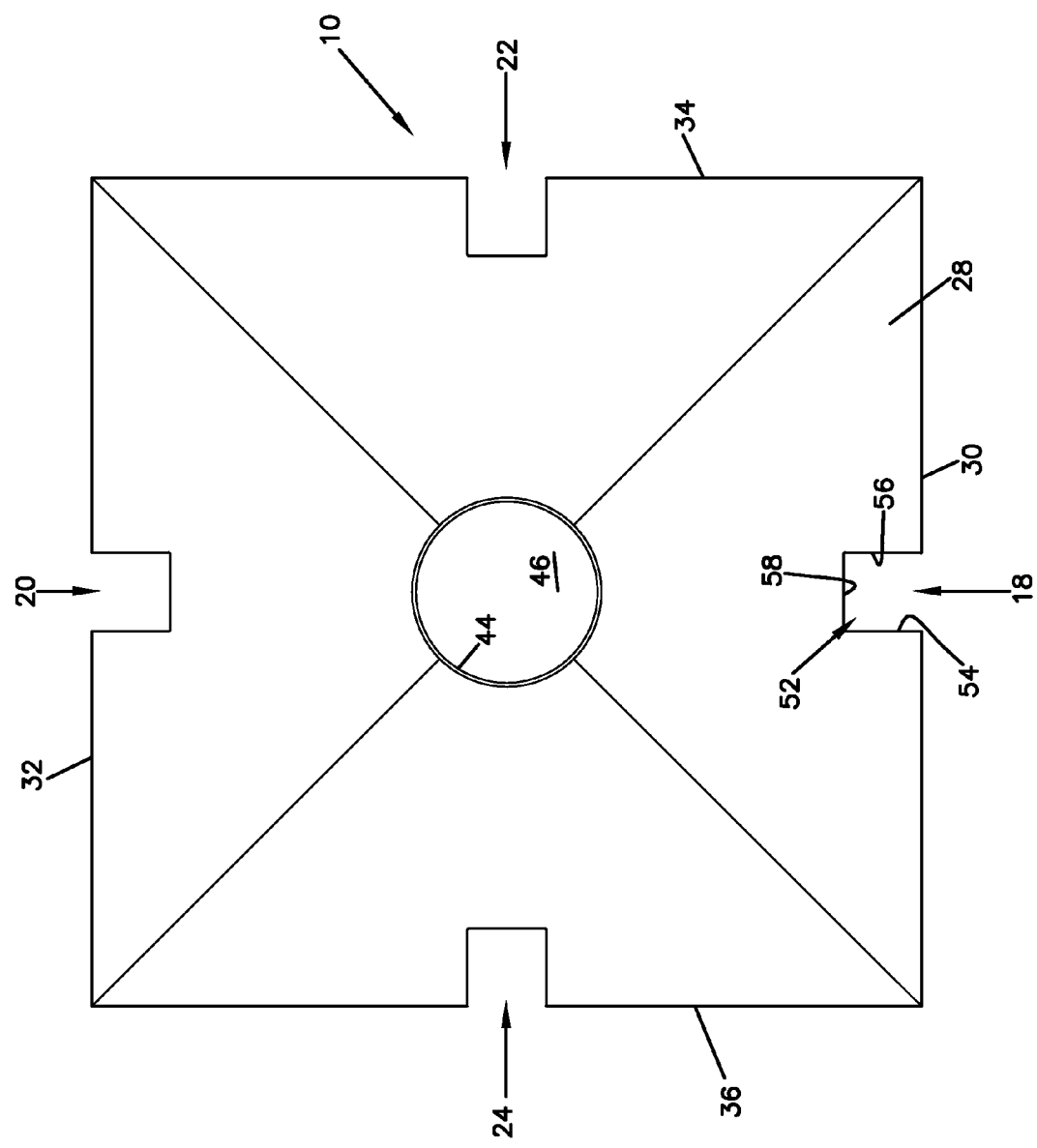
FIG. 4 is a top view of the telecommunications system of FIG. 1.

As shown in the exploded view of FIG. 2, the chassis 12 defines a heat dissipation structure 42 in the form of a central conduit 44 that passes through the chassis 12 from the top end 14 to the bottom end 16. As will be described in further detail below, the conduit 44 defines a centrally located opening 46 that is configured to dissipate heat from the chassis 12 in a direction from the bottom end 16 of the chassis 12 toward the top end 14 of the chassis 12. The conduit 44 is configured to act as a chimney in guiding higher temperature air upwardly and out of the top end 14 of the chassis 12. The centrally located opening 46 defines a central longitudinal axis 48 of the chassis 12.

As shown, the heat dissipation structure 42 extends through the center of the chassis 12, which provides space therearound for telecommunications equipment 39 to be mounted within the interior 40 of the chassis 12.

Still referring to FIGS. 1-4, the equipment 26 mounted to the bottom end 16 of the chassis 12 may be modular equipment that are separately mounted in a stackable arrangement. According to one example embodiment, the equipment 26 may include a fan tray that is configured to force higher temperature air upwardly out of central opening 46 at the top end 14 of the chassis 12. Other embodiments of the equipment 26 may include telecommunications equipment such as power modules, monitoring devices, etc. that may be configured to be connected to the telecommunications equipment 39 mounted within the interior 40 of the chassis 12 around the central opening 46.

In one embodiment, wherein the chassis 12 is mounted in a reversed orientation such as in the application shown in FIG. 5, the equipment 26 mounted on the top end 14 of the chassis 12 may provide suction to move the higher temperature air toward the top end 14 of the chassis 12.

Still referring to FIGS. 1-5, the angled outer walls 30, 32, 34, 36 of the chassis 12 are configured to provide cable management for cabled connectors or plugs that might be connected to the equipment 39 within the chassis 12. Due to the angled configuration of the walls 30, 32, 34, 36 (e.g., when viewed from a side elevational view), the ports 38 along a given column from top to bottom are positioned at different depths in a direction from right to left. In this manner, cables 50 extending from ports 38 along a given column do not interfere with cables 50 from ports 38 above or below thereof and each cable 50 is provided with its own path as it extends from the top end 14 of the chassis 12 toward the bottom end 16. Please see FIG. 3.

In addition to the angled configuration of the sidewalls 30, 32, 34, 36 in providing effective cable management, the chassis 12 also provides for further cable management features around the outer periphery of the chassis 12. Each of the front wall 30, rear wall 32, right wall 34, and the left wall 36 defines a cable channel or trough 52 that extends from the top end 14 to the bottom end 16 of the chassis 12 parallel to the walls 30, 32, 34, 36. As shown, each cable trough 52 runs through the center of each wall 30, 32, 34, 36 (i.e., bisects its associated wall as it extends from the top end 14 to the bottom end 16). As shown, each cable trough 52 is defined by a first sidewall 54, a second sidewall 56, and a center wall 58 that connects the first sidewall 54 to the second sidewall 56.

Cables 50 extending from the receptacles or the ports 38 of the chassis 12 may be guided through the cable troughs 52. According to one example embodiment, cable management structures 60 in form of cable management rings 62 may be used at locations adjacent the troughs 52 for keeping cables 50 organized within the troughs 52. For example, the cable management rings 62 may be attached to the first sidewall 54 defining the trough 52, to the second sidewall 56 defining the trough 52, to the center wall 58 defining the trough 52, or to the walls 30, 32, 34, 36 that include the ports 38 of the chassis 12, at locations adjacent the troughs 52. Other locations are certainly possible. In a preferred embodiment, each row of ports 38 may be provided with a corresponding row of cable management rings 62.

Even though the chassis 12 of the present disclosure has been shown with cable troughs 52 that extend through the center of each of the front, rear, right, and left walls 30, 32, 34, 36, cable troughs 52 may also be positioned at the corners of the pyramidal structure, wherein each corner may be cut out or relieved to provide for channels defining cable management troughs 52.

Figure 25:
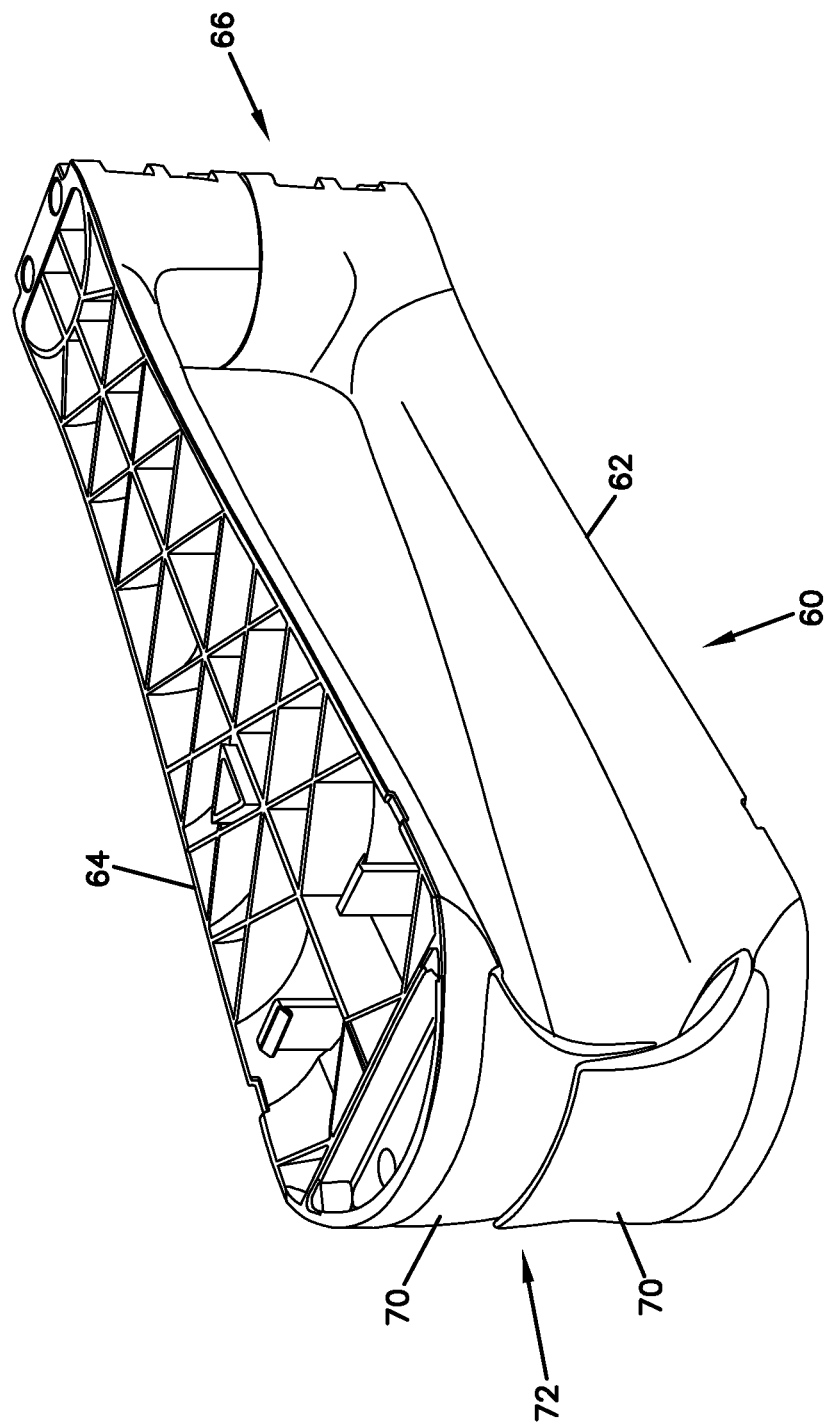
FIG. 25 illustrates a cable management structure in the form of a cable management ring that is suitable for use with the chassis of FIGS. 1-5 and the chassis of FIGS. 6-11.

An example cable management ring 62 that may be suitable for use with the chassis 12 of the present disclosure is shown in FIG. 25. According to one embodiment, the cable management ring 62 shown in FIG. 25 may be manufactured out of various types of polymers. The cable management ring 62 includes an upper half 64 that is attached at a first end 66 to a lower half 68. Each of the upper half 64 and the lower half 68 defines a transverse extension 70 (e.g. a flexible flap) at a second end 72. The extensions 70 overlap or intermate to capture a cable 50 passing through the ring 62 between the upper half 64 and the lower half 68. If a cable 50 needs to be inserted into or removed from the cable management ring 62, it is passed through the flexible extensions 70 from the second end 72 thereof. When the cable management rings 62 are mounted to telecommunications structures such as the chassis 12 of the present disclosure, the rings 62 are mounted adjacent their first ends 66.

It should be noted that the cable management ring 62 illustrated in FIG. 25 and described above is only one example of a variety of different cable management structures 60 that may be used around the cable troughs 52 of the chassis 12 of the present disclosure, and other structures are possible.

FIGS. 6-11 illustrate the second embodiment of a telecommunications system 100 having features that are examples of inventive aspects in accordance with the present disclosure. The telecommunications system 100 includes a chassis 112 that is generally similar in construction to the chassis 12 described above and shown in FIGS. 1-5. The chassis 112 defines a slightly different overall shape than the chassis 12 of FIGS. 1-5 and is shown with equipment 26 mounted both to the top end 114 and to the bottom end 116 of the chassis 112.

As noted previously, the equipment 26 mounted at either the top end 114 or the bottom end 116 of the chassis 112 may include air moving equipment or telecommunications equipment such as power modules, monitoring devices, etc. that are configured to be connected to the equipment 39 mounted within an interior 140 of the chassis 112 around a central opening 146.

Even though the chassis 112 of FIGS. 6-11 is not shown with cable troughs, it can certainly be configured to include such cable management features as noted above.

Figure 6:
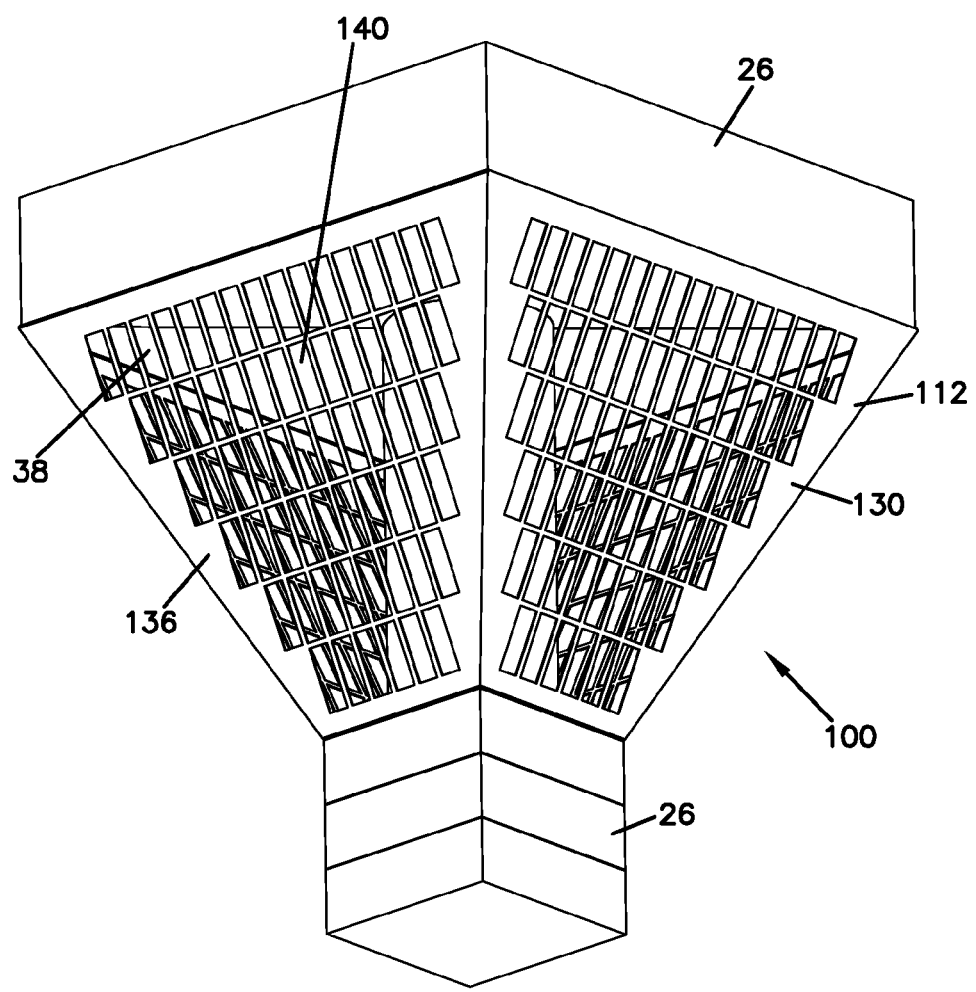
FIG. 6 is a bottom, front, left side perspective view of another embodiment of a telecommunications system having features that are examples of inventive aspects in accordance with the present disclosure.
Figure 7:
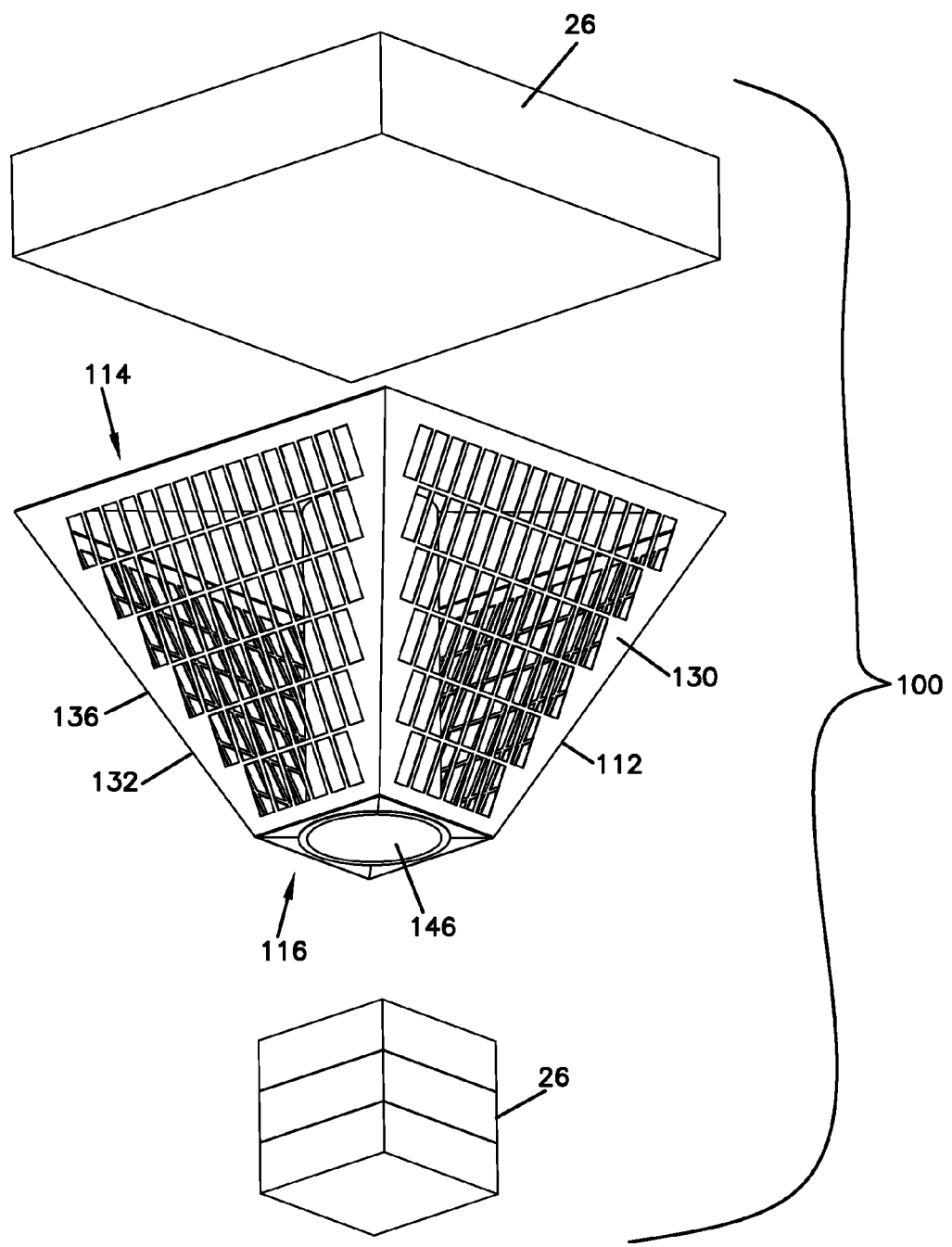
FIG. 7 illustrates the telecommunications system of FIG. 6 in an exploded configuration.
Figure 8:
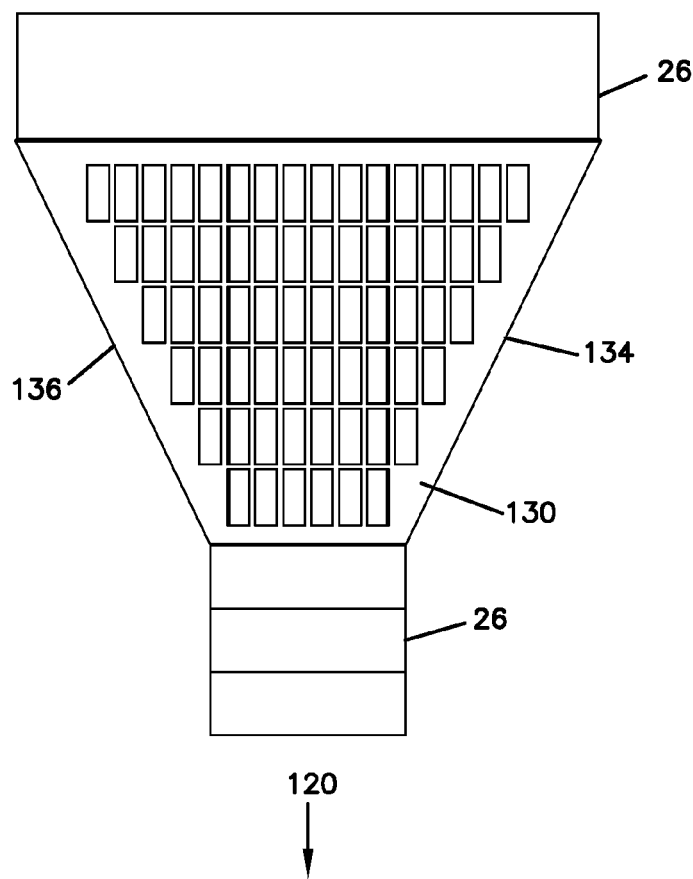
FIG. 8 is a front view of the telecommunications system of FIG. 6.
Figure 9:
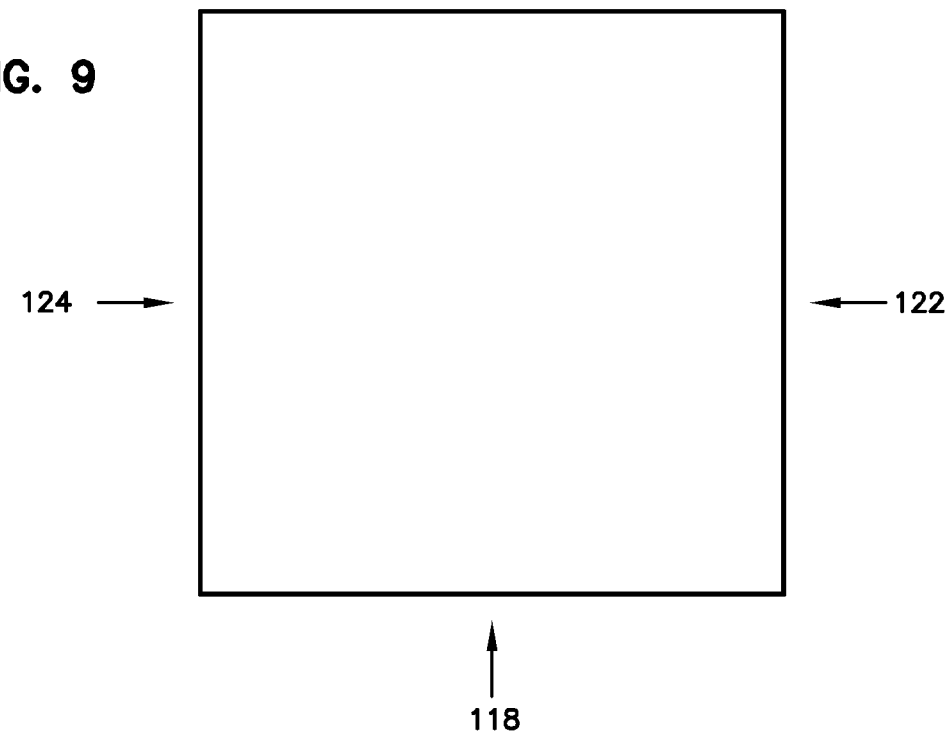
FIG. 9 is a top view of the telecommunications system of FIG. 6.
Figure 10:
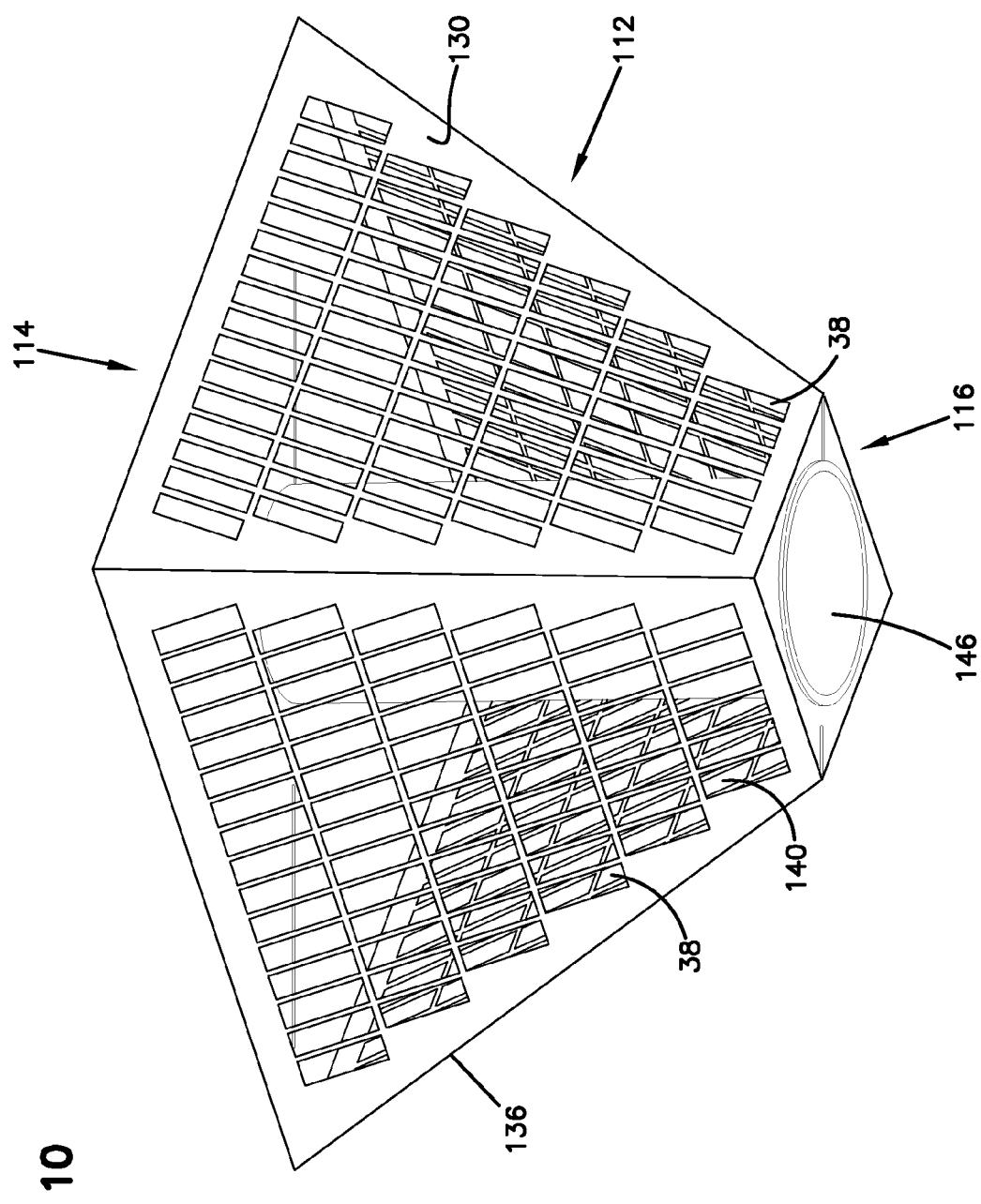
FIG. 10 illustrates the bottom, front, left perspective view of the chassis portion of the telecommunications system of FIG. 6 in isolation.
Figure 11:
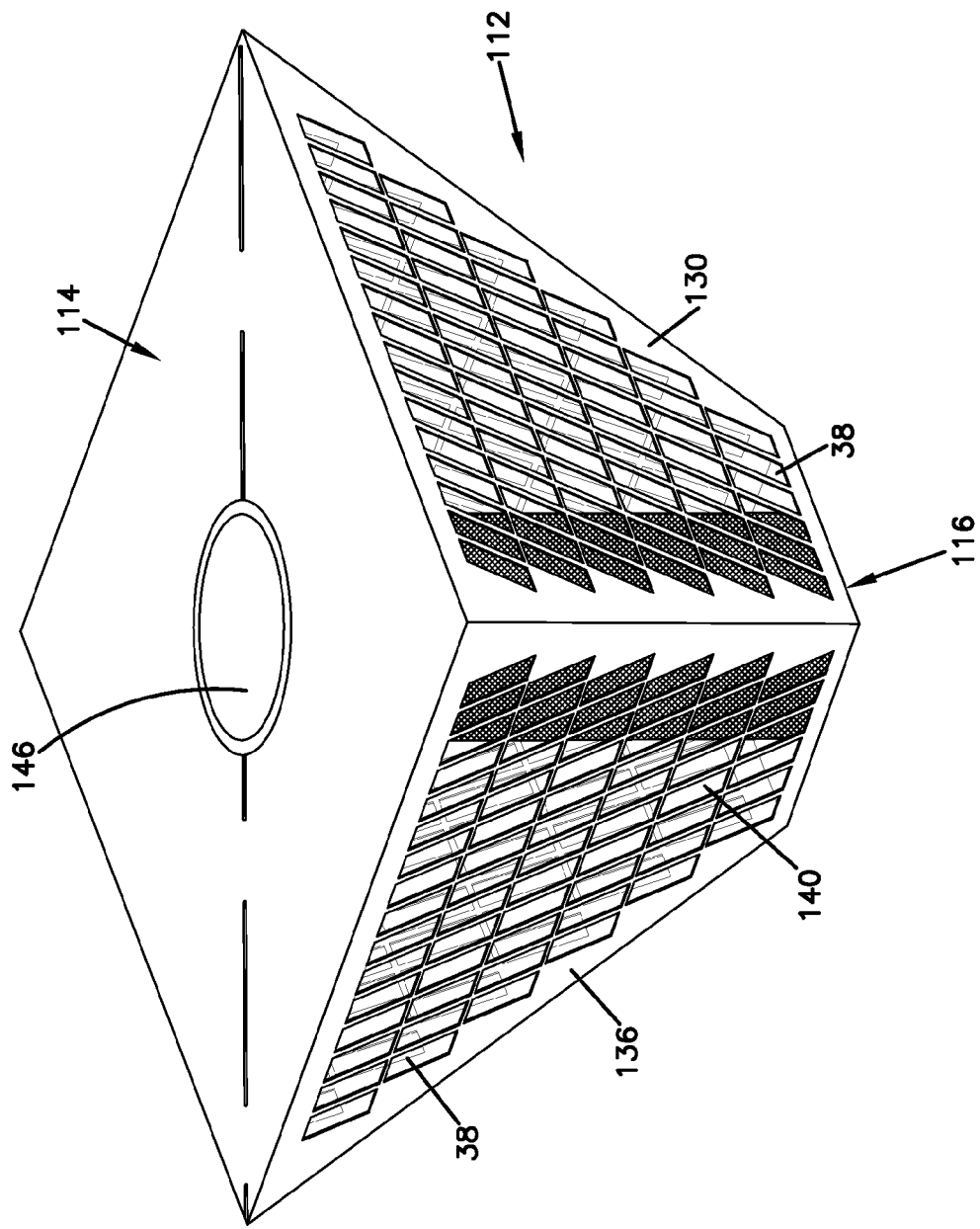
FIG. 11 illustrates the chassis of FIG. 10 in a different orientation.
Figure 12:
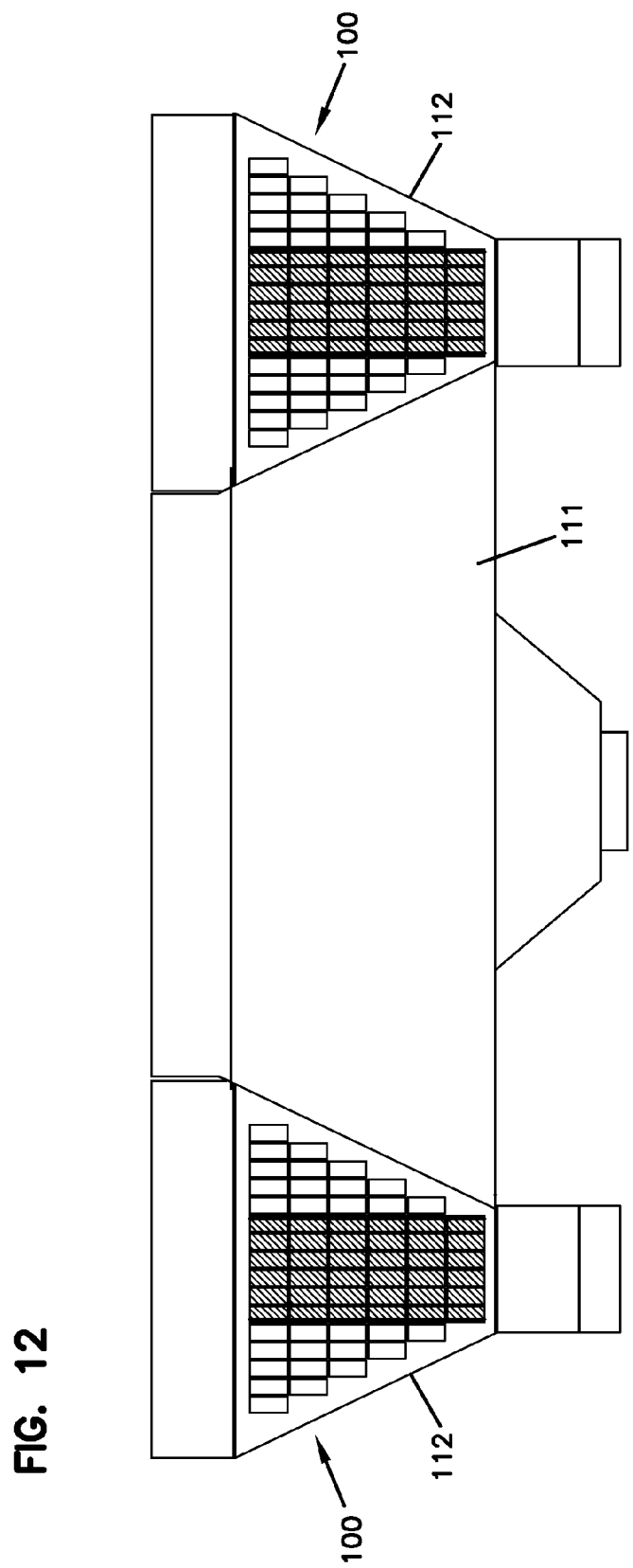
FIG. 12 illustrates two of the telecommunications systems of FIG. 6 connected together by a support structure.

FIG. 12 illustrates two of the telecommunications systems 100 of FIG. 6 connected together by a support structure 111. The support structure 111 may be used to support two spaced apart chassis 112 in a side-by-side orientation and also provide a pathway for any cabling 50 that might extend between the two chassis 112.

Figure 13:
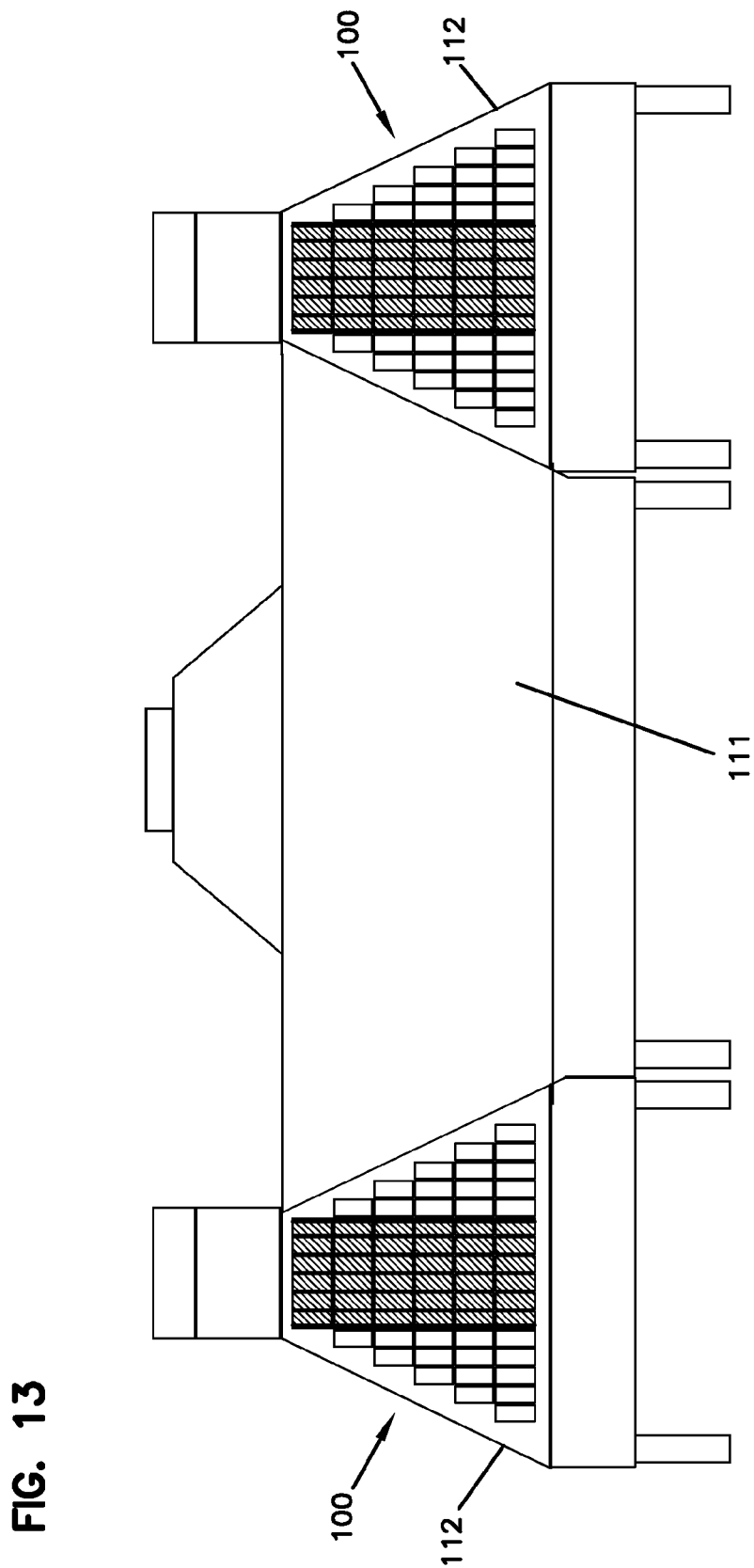
FIG. 13 illustrates the connected systems of FIG. 12 in a different orientation.

FIG. 13 illustrates the systems 100 connected by the support structure 111 of FIG. 12 in a different orientation that is 180 degrees from the orientation shown in FIG. 12.

Figure 14:
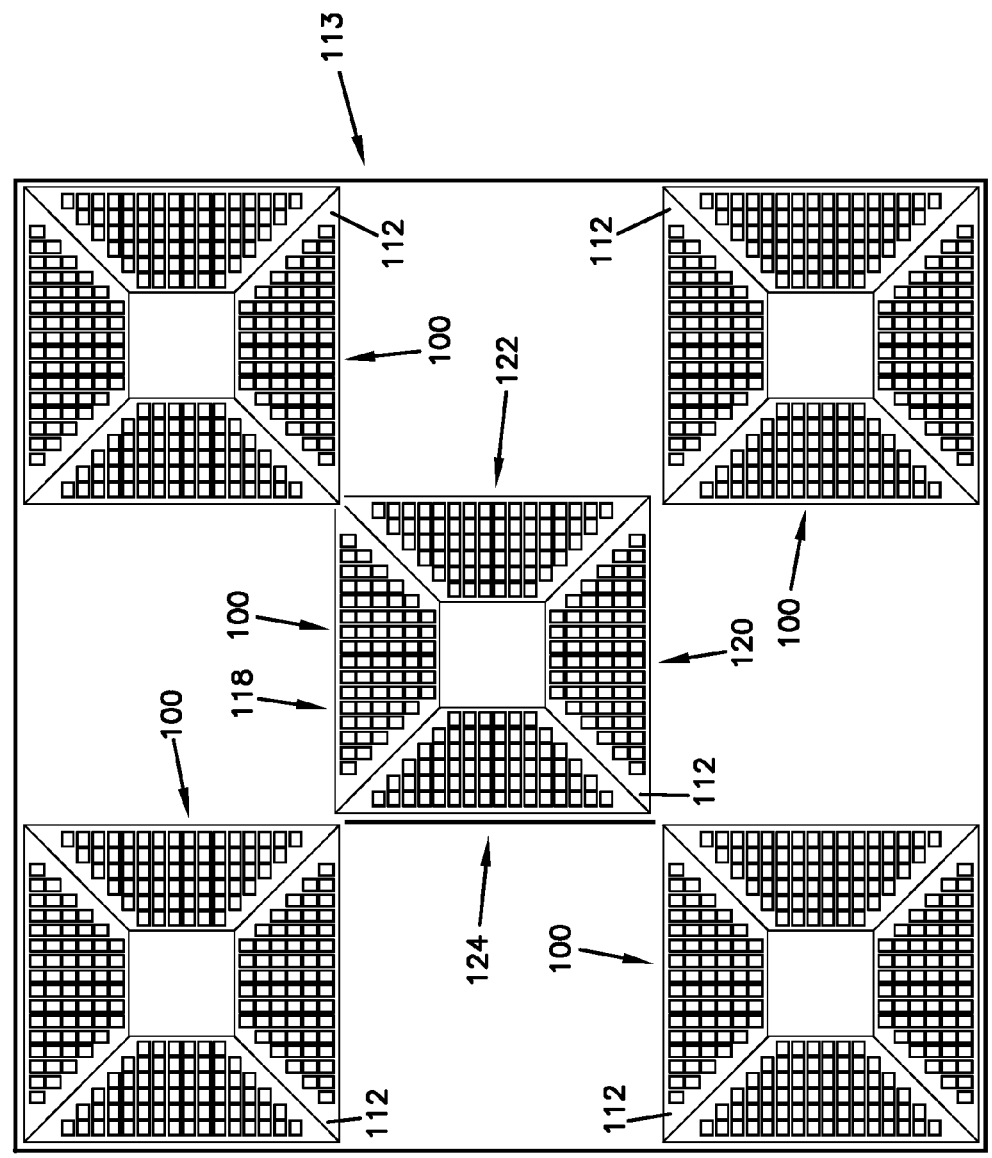
FIG. 14 illustrates a top view of a high density telecommunications environment including a plurality of the telecommunications systems of FIG. 6.

FIG. 14 includes an example layout or arrangement of a number of the telecommunications systems 100 of FIGS. 6-11 within a high density environment such as a data center 113. As shown, the chassis 112 may be positioned with their corners adjacent to each other, leaving room for access to the front sides 118, the rear sides 120, the rights sides 122, and the left sides 124 of the chassis 112.

As noted above, depending upon the desired layout or connectivity arrangement desired, different transverse cross-sectional footprints 28 may be used for forming the pyramidal shapes of the chassis 112, as shown in FIG. 15.

Referring now to FIGS. 16-19, in addition to the heat dissipation and cable management features discussed above, the chassis 12, 112 of the present disclosure are also configured to house telecommunications equipment 39, wherein the equipment 39 and the mounting arrangements within the chassis 12, 112 can provide various signal speeds between such equipment 39 within a given chassis. As will be described in further detail below, the chassis 12, 112, the mounted equipment 39, and the mounting arrangements are configured and shaped to provide multiple different speed zones for signals passing among equipment 39 mounted within the chassis 12, 112.

As is known, signal speed or signal performance between two pieces of telecommunications equipment can depend upon the connectivity length and/or the characteristics of the material of the medium transmitting the signals. For example, where the signal is transmitted through tracings on a medium such as a printed circuit board, trace length affects the speed of the signal. The longer the length, the longer the signal takes to get from a first point to a second point on the board. Also, the material choice for the printed circuit board may affect the speed of the signal. Normally, the faster the speed required or higher the performance, the higher the cost of the materials used for such circuit boards.

In a conventional system that normally utilizes rectangular or square footprints for the printed circuit boards, the traces from one end of the board to the other end of the board are similar in length. In such a system, if one of the signals needs travel at a certain speed or performance (e.g., higher speed) across a trace length extending across the printed circuit board, the entire circuit board must be manufactured from a material that can accommodate this required speed, even if this speed or performance is not required for the signals travelling on the other tracings. This type of printed circuit board construction leads to higher manufacturing costs that can otherwise be avoided or limited by the features of the systems of the present disclosure.

By utilizing telecommunications equipment 39 comprising triangularly shaped printed circuit boards 200 (i.e., cards) that are configured to mate with the pyramidal configurations of the chassis 12, 112, the systems 10, 100 of the present disclosure can provide a way to place high speed signal connections closer to each other, enabling a manufacturer to cut down on the costs for manufacturing the printed circuit boards 200. According to one embodiment, the triangular card 200 may define a right-triangle shape (e.g., including two right-angle sides connected together by a third side).

Figure 19:
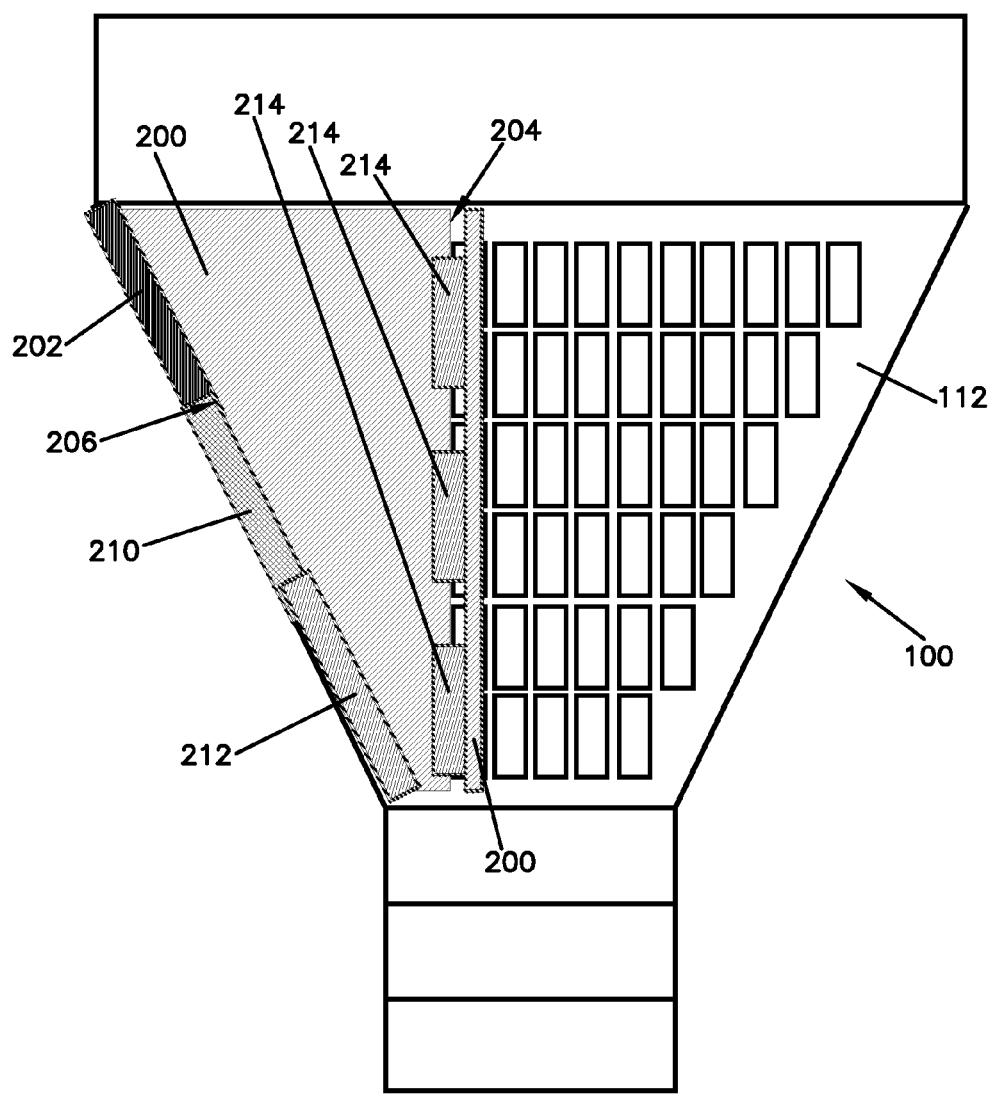
FIG. 19 diagrammatically illustrates the different signal speed zones associated with the telecommunications equipment mounted in accordance with the arrangement illustrated in FIGS. 16-18.

As shown in FIG. 19, when using a triangular card 200, the upper portion 202 of the card 200 (wherein the distance from a right side 204 of the card 200 to a left side 206 is the greatest) may be reserved for a low speed section (such as a power section) of the board 200. The center portion 210 of the card 200 may be reserved for the medium speed tracings. The lower portion 212 of the card 200 (wherein the distance from the right side 204 of the card 200 to the left side 206 is the shortest) may be reserved for higher speed signals that can be achieved with the shortest tracings. As noted above, if the triangular printed circuit board 200 has the shape of a right triangle, then right side 204 would be one of the right-angle sides of the triangle and the left side 206 would be the third side of the triangle that connects the two right-angle sides.

Referring back to FIGS. 16-18, with the pyramidal configuration of the chassis 12, 112 of the present disclosure, the distance versus signal speed relationship can be maintained among all of the cards 200 that are mounted throughout the chassis 12, 112. As shown, a card 200 mounted within the interior 140 on the left side 124 of the chassis 112 can be connected to a card 200 mounted on the front side 118 of the chassis 112 in a perpendicular arrangement via connectors 214 (such as card edge connectors) within the chassis 112. In this manner, the longer trace lengths (for lower speed signals) can be positioned at the upper portions 202 of the cards 200 and the shorter trace lengths (for higher speed lengths) can be positioned at the lower sides 212 of the cards 200.

As shown, wherein the printed circuit board 200 defines a right triangular shape, the right sides 204 can include the telecommunications connectors 214 and the third side, the left side 206, can include ports 38 that define connection locations for receiving other telecommunications equipment from outside the chassis 112.

Figure 20:
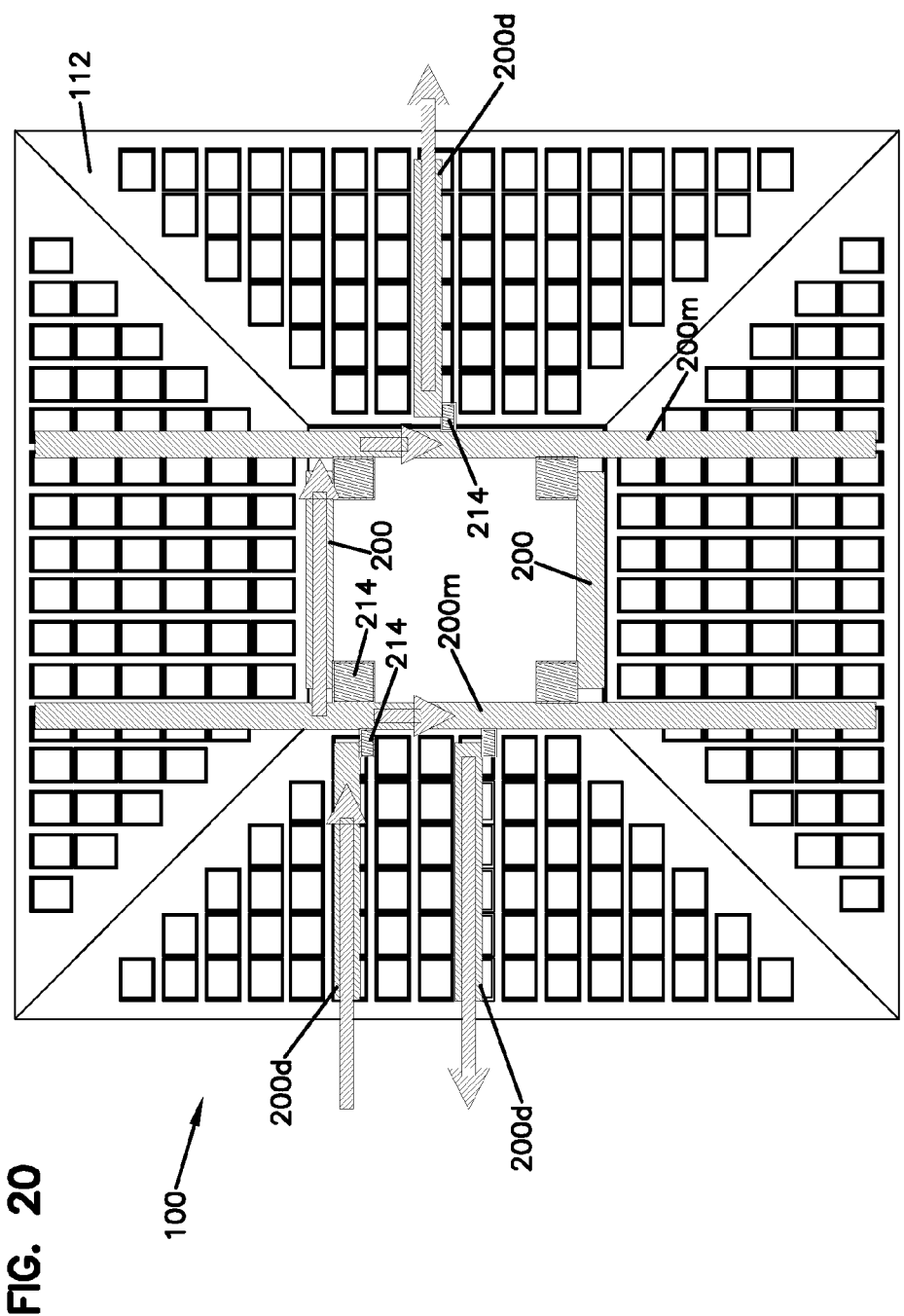
FIG. 20 diagrammatically illustrates the bottom view of the chassis of FIG. 6, with another example telecommunications equipment mounting arrangement.
Figure 21:
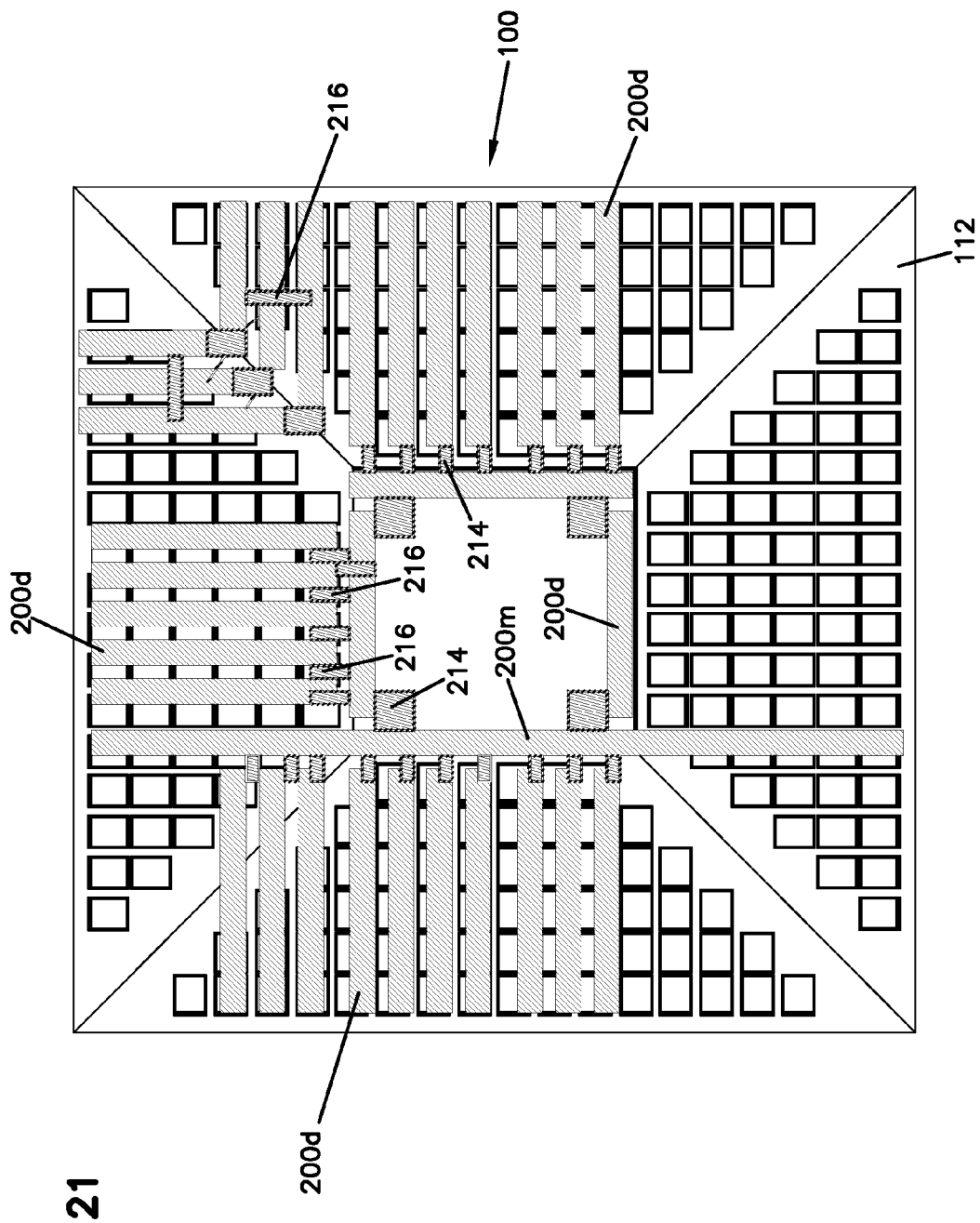
FIG. 21 diagrammatically illustrates the bottom view of the chassis of FIG. 6, with a further example telecommunications equipment mounting arrangement.
Figure 22:
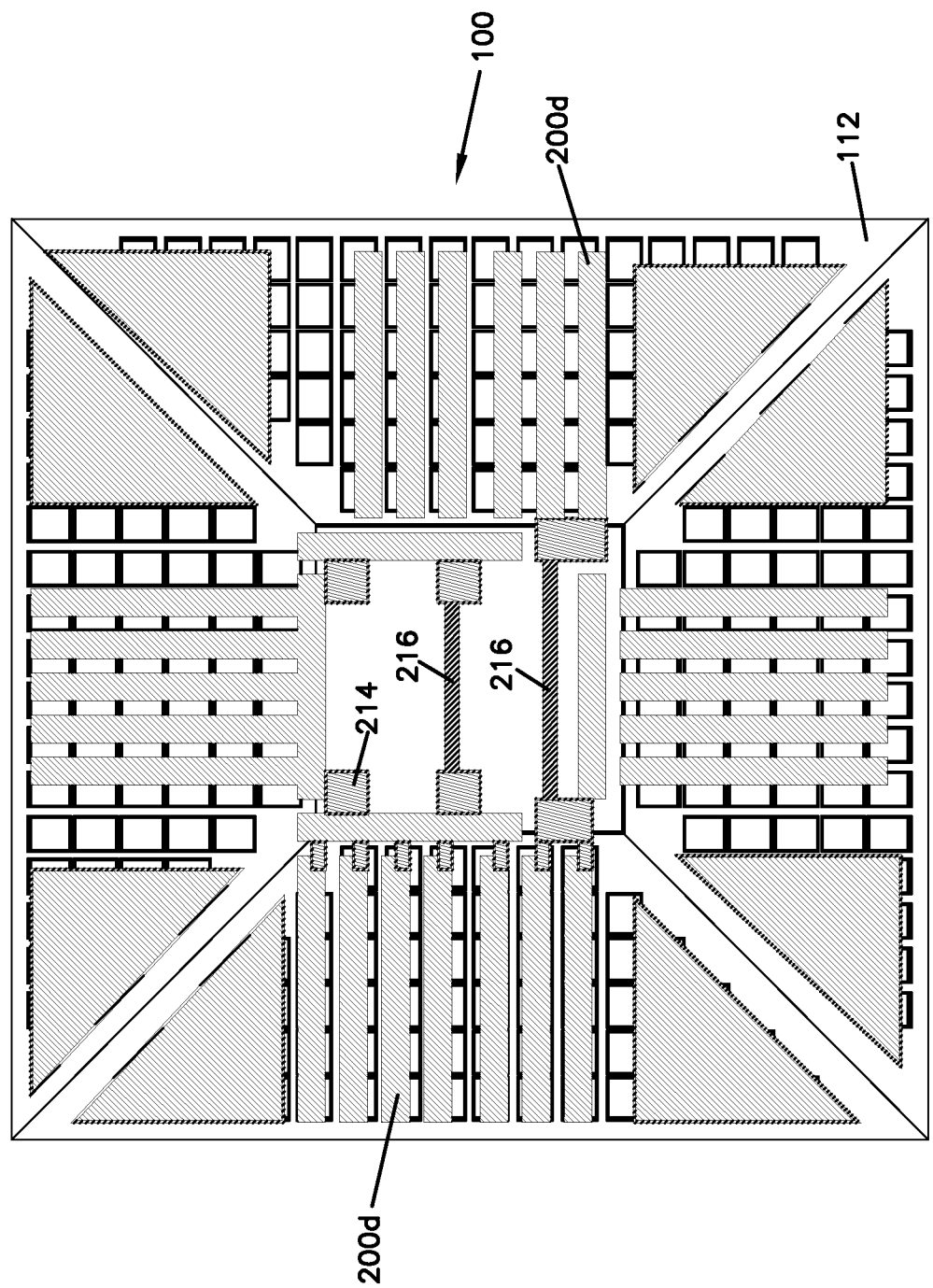
FIG. 22 diagrammatically illustrates the bottom view of the chassis of FIG. 6, with yet another example telecommunications equipment mounting arrangement.

Now referring to FIGS. 20-22, the general layout of the chassis 112, with each side 118, 120, 122, 124 of the chassis 112 positioned in a radial arrangement with respect to a central heat dissipation structure 142, allows great flexibility in signal connectivity. The radial layout of the chassis 112 allows conveyance of signals among equipment 39 mounted at different locations around the chassis 112.

For example, FIG. 20 diagrammatically illustrates the chassis 112 of FIG. 6 from a bottom view, wherein a pair of daughter cards 200*d* at the left side 124 of the chassis 112 are connected to a mother card 200*m* mounted adjacent the left side 124 of the chassis 112 with connectors 214, wherein the left mother card 200*m* is interconnected to another mother card 200*m* at the right side 122 of the chassis 112 by linking daughter cards 200*d*. Another daughter card 200*d* making a connection with the right mother card 200*m* can be connected to the daughter cards 200*d* at the left side 124 of the chassis 112 through this interior arrangement, with the higher speed signals provided through the shorter traces at the bottom portion 212 of the triangular cards 200 and the lower speed signals provided through longer traces at the top portion 202 of the triangular cards 200.

FIG. 21 illustrates the high level of density and freedom of interconnectivity that may be achieved with the systems 10, 100 of the present disclosure, wherein cards 200 are connected throughout via connectors 214. As shown with respect to the daughter cards 200c at the front side 118 of the chassis 112 that are all positioned next to each other in a parallel relationship, cards 200 within the chassis 112 may be configured to connect to each other with direct connections 216 such as with optical or copper connections.

FIG. 22 illustrates the use of direct connections 216 across the center of the pyramidal chassis 112 (e.g., with copper or optical cable interconnections) to provide for higher speed signals which may otherwise not be obtainable by going around the perimeter of the central heat dissipation zone. In such an arrangement, the corners of the pyramidal chassis 112 may be left unpopulated for providing cooling zones for the populated areas.

Figure 23:
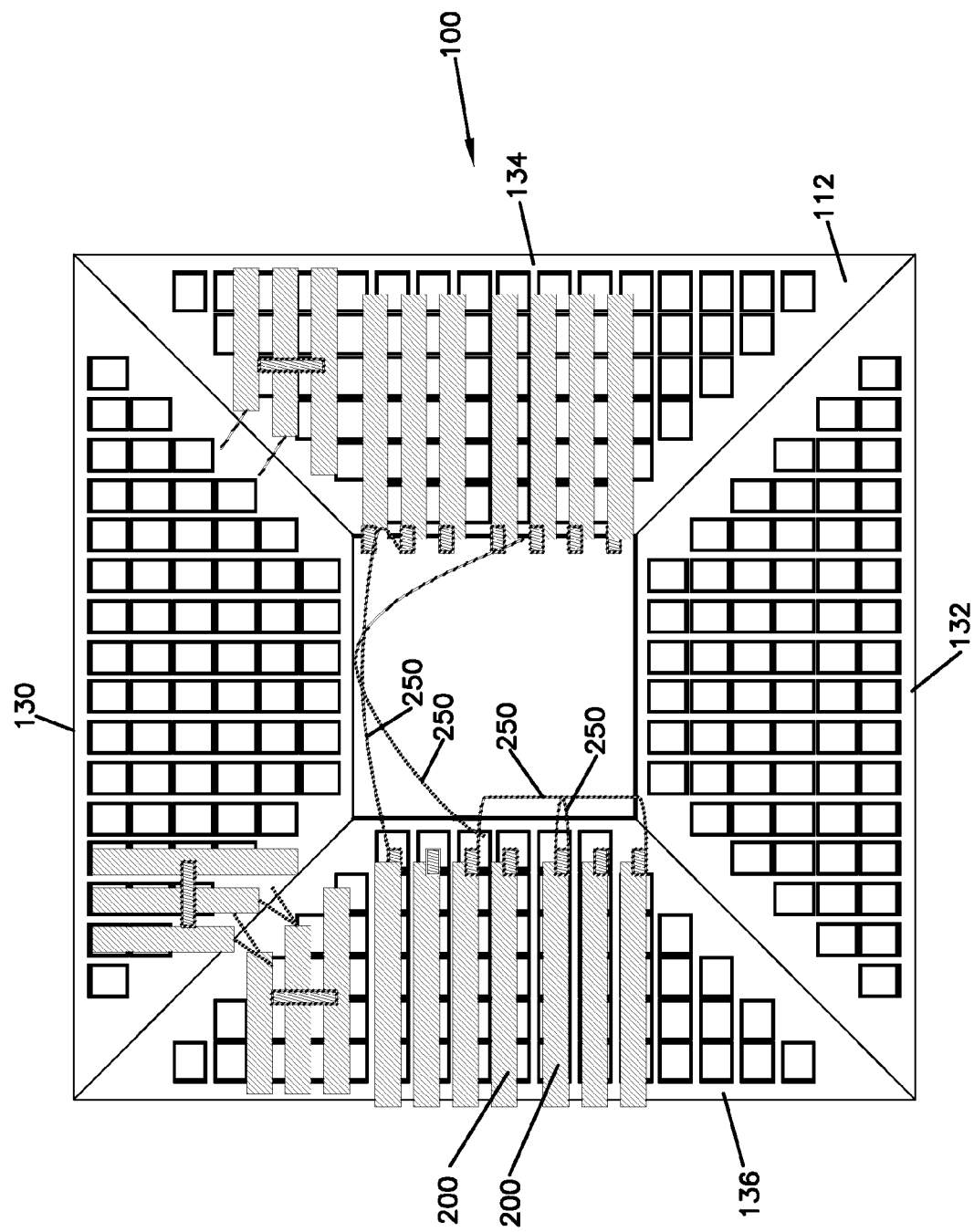
FIG. 23 diagrammatically illustrates the bottom view of the chassis of FIG. 6 showing how cables connecting the various equipment within mounting arrangements such as those of FIGS. 20-22 may be incorporated into the chassis.

FIG. 23 diagrammatically illustrates the bottom view of the chassis 112 of FIG. 6 showing how daughter cards 200d on a given side may be connected via cables 250 that are integrated or incorporated into the chassis 112 rather than through a mother card 200m or other interlinking cards 200. Such cabling 250 may be integrated or incorporated into the framework defining the walls 130, 132, 134, 136 of the chassis 112.

Figure 24:
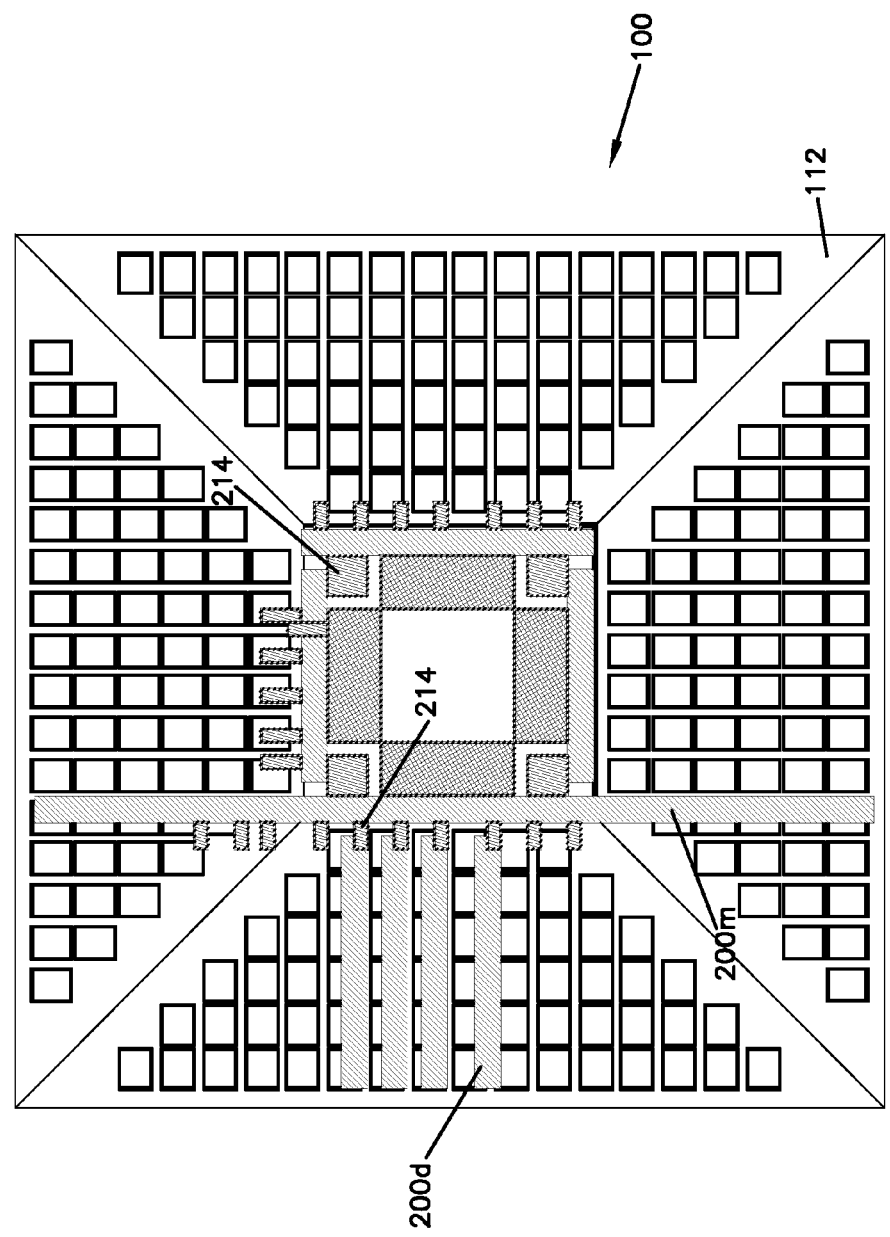
FIG. 24 diagrammatically illustrates the bottom view of the chassis of FIG. 6 showing how higher temperature equipment may be placed near the center of the chassis for heat dissipation purposes.

FIG. 24 diagrammatically illustrates the bottom view of the chassis 112 of FIG. 6 showing how higher temperature equipment 39 may be placed near the center of the chassis 112 (away from the radial card population area) for heat dissipation purposes.

It should be noted that all of the telecommunications equipment 39 (e.g., printed circuit boards/cards) and the mounting layouts and arrangements depicted and described herein are examples of the many various layouts and arrangements that can be provided with the systems 10, 100 of the present disclosure and are used to show example inventive aspects of such systems. The example layouts and arrangements should not be used to limit the scope of the present disclosure and the claims.

It should be noted that, although the chassis 12, 112 of the present disclosure have been depicted herein as defining a certain height or including a certain number of ports for receiving plugs or connectors at the connection locations of equipment 39 that might be within the chassis 12, 112, the chassis 12, 112 may be configured for a variety of equipment sizes and numbers. According to certain embodiments, the chassis 12, 112 may be manufactured in a certain height or size depending upon the desired connectivity application.

Examples of various inventive aspects of the present disclosure have been described herein. It will be appreciated that modifications and equivalents of the disclosed inventive aspects are intended to be included within the broad scope of the present disclosure.

LIST OF REFERENCE NUMERALS AND CORRESPONDING FEATURES

10—First embodiment of telecommunications system
12—First embodiment of telecommunications chassis
14—Top end
16—Bottom end
18—Front side
20—Rear side
22—Right side
24—Left side
26—Equipment
28—Transverse cross-sectional footprint
30—Front wall
32—Rear wall
34—Right wall
36—Left wall
38—Ports
39—Telecommunications equipment
40—Interior of chassis
42—Heat dissipation structure
44—Conduit
46—Central opening
48—Central longitudinal axis
50—Cable
52—Cable trough
54—First sidewall defining cable trough
56—Second sidewall defining cable trough
58—Center wall defining cable trough
60—Cable management structure
62—Cable management ring
64—Upper half of cable management ring
66—First end of cable management ring
68—Lower half of cable management ring
70—Transverse extension of cable management ring
72—Second end of cable management ring
100—Second embodiment of telecommunications system
111—Support structure
112—Second embodiment of telecommunications chassis
113—Data center
114—Top end of second embodiment of telecommunications chassis
116—Bottom end of second embodiment of telecommunications chassis
118—Front side of second embodiment of telecommunications chassis
120—Rear side of second embodiment of telecommunications chassis
122—Right side of second embodiment of telecommunications chassis
124—Left side of second embodiment of telecommunications chassis
130—Front wall of second embodiment of telecommunications chassis
132—Rear wall of second embodiment of telecommunications chassis
134—Right wall of second embodiment of telecommunications chassis
136—Left wall of second embodiment of telecommunications chassis
140—Interior of second embodiment of telecommunications chassis
146—Central opening of second embodiment of telecommunications chassis
200—Printed circuit board/card
200d—Daughter board/card
200m—Mother board/card
202—Upper portion of card
204—Right side of card
206—Left side of card
210—Center portion of card
212—Lower portion of card
214—Connector
216—Direct connection
250—Cable

We claim:

1. A telecommunications system comprising:
a telecommunications chassis defining a top end, a bottom end, and a generally pyramidal shape, wherein a transverse cross-sectional footprint of the chassis changes in outer dimension in a direction extending from the top end to the bottom end, the telecommunications chassis further defining at least three intersecting sidewalls defining the generally pyramidal shape, the at least three intersecting sidewalls each extending at an acute angle to both the top end and the bottom end, the at least three intersecting sidewalls each defining ports for receiving exterior connectors or plugs, wherein the ports, via the exterior connectors or plugs, are configured to provide access to electrical connection locations defined by telecommunications equipment mounted within an interior of the telecommunications chassis, the telecommunications equipment mounted within the chassis including a printed circuit board having a generally triangular shape defining two right-angle sides and a third side connecting the two right-angle sides, wherein at least one of the two right-angle sides defines telecommunications connectors for connecting to other telecommunications equipment within the chassis, and the third side defines the electrical connection locations accessible through the ports of the telecommunications chassis.

2. A telecommunications system according to claim 1, wherein the transverse cross-sectional footprint is a triangle.

3. A telecommunications system according to claim 1, wherein the transverse cross-sectional footprint is a square.

4. A telecommunications system according to claim 1, wherein the transverse cross-sectional footprint is a rectangle.

5. A telecommunications system according to claim 1, wherein the transverse cross-sectional footprint is a hexagon.

6. A telecommunications system according to claim 3, wherein the telecommunications chassis defines a front wall, a rear wall, a left wall, and a right wall, each of the front, rear, left, and right walls defining ports.

7. A telecommunications system according to claim 1, wherein the telecommunications chassis defines a central longitudinal axis extending between the top end and the bottom end and an opening extending therethrough in a direction parallel to the central longitudinal axis.

8. A telecommunications system according to claim 7, wherein the opening is a central opening defining the central longitudinal axis.

9. A telecommunications system according to claim 1, further comprising a cable trough extending between the top end and the bottom end, the cable trough extending parallel to the at least one sidewall.

10. A telecommunications system according to claim 9, wherein the cable trough is defined by the at least one sidewall.

11. A telecommunications system according to claim 10, wherein the cable trough bisects the at least one sidewall as the trough extends from the top end to the bottom end.

12. A telecommunications system according to claim 1, wherein the transverse cross-sectional footprint of the chassis decreases in outer dimension as the transverse cross-sectional footprint extends from the top end to the bottom end.

13. A telecommunications system according to claim 1, wherein the transverse cross-sectional footprint of the chassis increases in outer dimension as the transverse cross-sectional footprint extends from the top end to the bottom end.

14. A telecommunications system according to claim 1, wherein the telecommunications equipment includes at least two connected printed circuit boards mounted generally perpendicular to each other.

15. A telecommunications system according to claim 1, further comprising air moving equipment mounted to at least one of the top end and the bottom end of the telecommunications chassis.

16. A telecommunications system comprising:
a telecommunications chassis defining a top end, a bottom end, and a central longitudinal axis extending between the top end and the bottom end, the telecommunications chassis defining a generally pyramidal shape, wherein a transverse cross-sectional footprint of the chassis changes in outer dimension in a direction extending from the top end to the bottom end, the telecommunications chassis further defining a front wall, a rear wall, a right wall, and a left wall, each of the front, rear, right, and left walls extending at an acute angle to both the top end and the bottom end and each of the front, rear, right, and left walls defining ports for receiving exterior connectors or plugs;
a central opening extending through the chassis in a direction parallel to the central longitudinal axis; and
a cable trough defined by each of the front, rear, right, and left walls, extending between the top end and the bottom end, each cable trough extending parallel to its associated front, rear, right, and left wall;
wherein the ports, via the exterior connectors or plugs, are configured to provide access to electrical connection locations defined by telecommunications equipment mounted within an interior of the telecommunications chassis around the central opening, the telecommunications equipment mounted within the chassis including a printed circuit board having a generally triangular shape defining two right-angle sides and a third side connecting the two right-angle sides, wherein at least one of the two right-angle sides defines telecommunications connectors for connecting to other telecommunications equipment within the chassis, and the third side defines the electrical connection locations accessible through the ports of the telecommunications chassis.

17. A telecommunications system according to claim 16, wherein the transverse cross-sectional footprint of the chassis decreases in outer dimension as the transverse cross-sectional footprint extends from the top end to the bottom end.

18. A telecommunications system according to claim 16, wherein the transverse cross-sectional footprint of the chassis increases in outer dimension as the transverse cross-sectional footprint extends from the top end to the bottom end.

19. A telecommunications system according to claim 16, wherein the telecommunications equipment includes at least two connected printed circuit boards mounted generally perpendicular to each other.

20. A telecommunications system according to claim 16, wherein each of the cable troughs bisects its associated front, rear, right, and left wall.

21. A telecommunications system comprising:
a telecommunications chassis defining a top end, a bottom end, and a central longitudinal axis extending between the top end and the bottom end, the telecommunications chassis including ports around an outer perimeter of the telecommunications chassis for receiving exterior connectors or plugs, wherein the telecommunications chassis provides 360 degree accessibility around the perimeter of the telecommunications chassis to the ports; and a central heat dissipation structure defining an opening extending through the chassis in a direction parallel to the central longitudinal axis, wherein the telecommunications chassis defines a generally pyramidal shape, wherein a transverse cross-sectional footprint of the chassis changes in outer dimension in a direction extending from the top end to the bottom end, the telecommunications chassis further defining at least three intersecting sidewalls defining the generally pyramidal shape, the at least three sidewalls each extending at an acute angle to both the top end and the bottom end, each of the at least three intersecting sidewalls defining the ports;

wherein the ports, via the exterior connectors or plugs, are configured to provide access to electrical connection locations defined by telecommunications equipment mounted within an interior of the telecommunications chassis around the opening, the telecommunications equipment mounted within the chassis including a printed circuit board having a generally triangular shape defining two right-angle sides and a third side connecting the two right-angle sides, wherein at least one of the two right-angle sides defines telecommunications connectors for connecting to other telecommunications equipment within the chassis, and the third side defines the electrical connection locations accessible through the ports of the telecommunications chassis.

22. A telecommunications system according to claim 21, wherein the transverse cross-sectional footprint is a triangle.

23. A telecommunications system according to claim 21, wherein the transverse cross-sectional footprint is a square.

24. A telecommunications system according to claim 21, wherein the transverse cross-sectional footprint is a rectangle.

25. A telecommunications system according to claim 21, wherein the transverse cross-sectional footprint is a hexagon.

26. A telecommunications system according to claim 23, wherein the telecommunications chassis defines a front wall, a rear wall, a left wall, and a right wall, each of the front, rear, left, and right walls defining ports.

* * * * *